United States Patent
How

(10) Patent No.: US 9,685,957 B2
(45) Date of Patent: Jun. 20, 2017

(54) SYSTEM RESET CONTROLLER REPLACING INDIVIDUAL ASYNCHRONOUS RESETS

(71) Applicant: Altera Corporation, San Jose, CA (US)

(72) Inventor: Dana How, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 25 days.

(21) Appl. No.: 14/249,292

(22) Filed: Apr. 9, 2014

(65) Prior Publication Data
US 2015/0295579 A1    Oct. 15, 2015

(51) Int. Cl.
*H03K 19/177* (2006.01)
*G06F 17/50* (2006.01)

(52) U.S. Cl.
CPC ..... *H03K 19/1774* (2013.01); *G06F 17/5054* (2013.01)

(58) Field of Classification Search
CPC ........... H03K 5/1252; H03K 19/17748; H03K 19/17728; H03K 19/1774; G06F 17/5022; G06F 21/554; G06F 21/57; G06F 21/575; G06F 21/64; G06F 21/71; G06F 17/5045; G06F 17/505; G06F 1/24; G06F 17/5031; G06F 17/5027; G06F 17/5077; G06F 1/12; G06F 2217/84; G06F 2217/86; G06F 2217/06; G06F 2217/62
See application file for complete search history.

(56) References Cited

U.S. PATENT DOCUMENTS

| | | | | |
|---|---|---|---|---|
| 5,513,358 | A * | 4/1996 | Lundberg | G06F 1/24 327/143 |
| 7,594,211 | B1 * | 9/2009 | Tian | G06F 17/505 716/113 |
| 7,626,420 | B1 * | 12/2009 | Cohen | H03K 19/20 326/37 |
| 2003/0140337 | A1 * | 7/2003 | Aubury | G06F 11/3409 717/158 |
| 2003/0204713 | A1 * | 10/2003 | Hales | G06F 1/24 713/1 |
| 2004/0194038 | A1 * | 9/2004 | Tamai | G06F 17/5045 716/104 |
| 2009/0144588 | A1 * | 6/2009 | Pothireddy | G06F 11/28 714/49 |
| 2011/0283250 | A1 * | 11/2011 | Manohararajah | 716/132 |
| 2012/0124407 | A1 * | 5/2012 | Shimizu | G06F 1/24 713/400 |
| 2013/0212356 | A1 * | 8/2013 | Stepanenko | G06F 15/80 712/20 |

* cited by examiner

*Primary Examiner* — Alexander H Taningco
*Assistant Examiner* — Seokjin Kim
(74) *Attorney, Agent, or Firm* — L. Cho

(57) ABSTRACT

An integrated circuit device comprises a system reset controller. The system reset controller includes a clock signal input, a reset signal input, a clock signal output, and a reset signal output. The system reset controller is arranged to receive distributed clock and reset signal inputs and output modified clock and reset signal outputs such that asynchronous reset inputs in downstream system components can be replaced by logic elements not requiring asynchronous reset inputs with no change in externally-visible behavior except the length of reset sequences as measured by clock pulses.

19 Claims, 17 Drawing Sheets

SYSTEM RESET CONTROLLER REPLACING INDIVIDUAL ASYNCHRONOUS RESETS

TECHNICAL FIELD

This present disclosure relates generally to electronic system designs. More specifically, this present disclosure relates to system reset controllers in programmable logic devices.

BACKGROUND

An electronic system design may incorporate any number of configurable or programmable logic devices, such as programmable logic devices (PLDs) or field programmable gate arrays (FPGAs). PLDs and FPGAs can be used to implement any logical function, for example, that an ASIC could perform. Additionally, PLDs and FPGAs are reconfigurable so as to allow updating of various programmable functions as needed. For example, FPGAs contain programmable logic elements and configurable and reconfigurable interconnects that allow the logic elements to be arranged together into different configurations to perform various functions. The logic elements generally also include memory elements, which may be simple flip-flops or more complete blocks of memory.

Some of the logic elements have asynchronous resets. However, asynchronous resets can create many problems in system design and optimization. For example, asynchronous resets can be difficult to merge with logic elements during logic synthesis. Thus, in some cases, it may be desirable to reduce the use of asynchronous resets in a design. Accordingly, it can be beneficial to provide a mechanism to address the aforementioned problems.

SUMMARY

The following presents a simplified summary of the disclosure in order to provide a basic understanding of certain embodiments of the present disclosure. This summary is not an extensive overview of the disclosure, and this summary does not identify key/critical elements of the present disclosure or delineate the scope of the present disclosure. Its sole purpose is to present some concepts disclosed herein in a simplified form as a prelude to the more detailed description that is presented later.

In one embodiment, an integrated circuit device including a system reset controller is provided. The system reset controller comprises a clock signal input, a reset signal input, a clock signal output, and a reset signal output. The system reset controller is arranged to receive distributed clock and reset signal inputs and output modified clock and reset signal outputs such that asynchronous reset inputs in downstream system components can be replaced by logic elements not requiring asynchronous reset inputs, with no change in externally-visible behavior except the length of reset sequences as measured by clock pulses.

In one implementation, the logic elements not requiring asynchronous reset inputs include multiplexors. In one implementation, logic elements with asynchronous reset inputs are replaced by logic elements that do not require or have asynchronous reset inputs. In one implementation, the controller is further arranged to generate a free-running clock such that a circuit coupled to the controller can be properly reset in the absence of an externally-applied clock. In one implementation, the controller is further arranged to ensure a parameterized minimum number of clock pulses in any generated reset sequence. In one implementation, the controller is generated, inserted, or parameterized via a software library function, such as a MegaFunction. In one implementation, the controller further comprises configuration RAM containing information that specifies parameterized parts of controller behavior, the information including the number of clock cycles in the reset sequence. In one implementation, the system reset controller is further arranged to back-annotate sufficient information into the user-specified design in order to allow a simulator to correctly simulate actual reset behavior. In one implementation, the system reset controller includes a clock multiplexor that selects between the clock input signal or an internal oscillator output signal.

In another embodiment, a method is provided. The method comprises receiving a first design for an integrated circuit. The first design includes logic elements requiring or having asynchronous reset inputs. The method also includes generating a second design for an integrated circuit. The second design modifies the first design. The second design includes inserting a system reset controller. The system reset controller includes a clock signal input, a reset signal input, a clock signal output, and a reset signal output. The system reset controller is arranged to receive distributed clock and reset signal inputs and output modified clock and reset signal outputs such that asynchronous reset inputs in downstream system components can be replaced by logic elements not requiring asynchronous reset inputs, with no change in externally-visible behavior except the length of reset sequences as measured by clock pulses. The method also includes converting downstream resets from asynchronous resets to synchronous resets.

In a specific implementation, the logic elements not requiring asynchronous reset inputs include multiplexors. In one implementation, the logic elements with asynchronous reset inputs are replaced by logic elements that do not require or have asynchronous reset inputs. In one implementation, the method further comprises back-annotating sufficient information into the user-specified design in order to allow a simulator to correctly simulate actual reset behavior. In one implementation, the method further comprises simplifying the second design by identifying resets that are time-delayed re-implementations of resets earlier in the data-path, removing the identified resets, and increasing the length of the system reset controller's reset sequence such that non-removed resets earlier in the data-path have sufficient time to propagate forward to the locations of the removed identified resets. In one implementation, the system reset controller is generated, inserted, and parameterized via a software library function. In one implementation, the software library function is a MegaFunction. In one implementation, the controller is further arranged to generate a free-running clock such that a circuit coupled to the controller can be properly reset in the absence of an externally-applied clock. In one implementation, the controller is further arranged to ensure a parameterized minimum number of clock pulses in any generated reset sequence. In one implementation, the controller further comprises configuration RAM containing information that specifies parameterized parts of controller behavior, the information including the number of clock cycles in the reset sequence. In one implementation, the system reset controller includes a clock multiplexor that selects between the clock input signal or an internal oscillator output signal.

These and other features of the present disclosure will be presented in more detail in the following specification of

DETAILED DESCRIPTION OF THE SPECIFIC EMBODIMENTS

Figure 1:
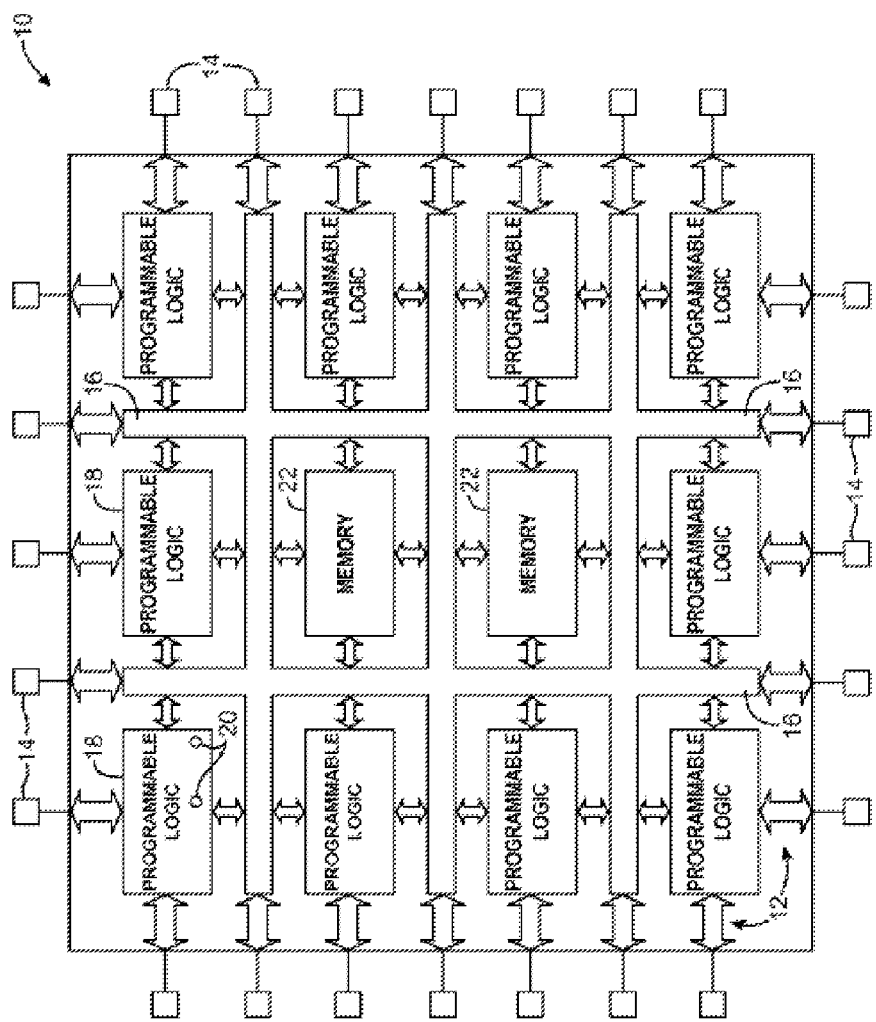
FIG. 1 is a diagrammatic representation of an integrated circuit, such as a programmable integrated circuit, in accordance with various embodiments of the present disclosure.

In the following description, numerous specific details are set forth in order to provide a thorough understanding of the present disclosure. The present disclosure may be practiced without some or all of these specific details. In other instances, well known process operations have not been described in detail so as to not obscure the present disclosure. While the present disclosure will be described in conjunction with the specific embodiments, such specific description is not intended to limit the present disclosure to these embodiments.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

Reference will now be made in detail to various embodiments, examples of which are illustrated in the accompanying drawings. In the following detailed description, numerous specific details are set forth in order to provide a thorough understanding of the present disclosure and the described embodiments. However, the present disclosure may be practiced without these specific details. In other instances, well-known methods, procedures, components, and circuits have not been described in detail so as not to unnecessarily obscure aspects of the embodiments.

Overview

An FPGA core commonly includes programmable logic components, such as look up tables (LUTs), as well as "hard" components such as IOs, memories, and DSP blocks. It is desirable to initialize each of these components at power-up, and possibly later on command as well. Consequently, these components can include input pins for asynchronous reset, synchronous reset, or both. An asynchronous reset requires more internal added logic to implement than a synchronous reset, which raises the cost of implementation. In addition, the significance of this cost increases with decreasing block size. Further, the function of an asynchronous reset is difficult to merge with other logic elements during logic synthesis of the design. A synchronous reset is easier to merge than an asynchronous reset. Asynchronous resets also create potentially undesirable constraints during other design optimization stages, such as during retiming. Finally, since asynchronous resets are hard to merge with other logic, their functionality when needed must be provided through expensive dedicated connections. One way to minimize the cost of these extra connections is to frequently share between multiple components requiring an asynchronous reset. However, this coupling reduces flexibility when physically implementing a design. For these reasons it is desirable to reduce the use of asynchronous resets in a design. Thus, various embodiments of the present disclosure are directed toward mechanisms and methods by which asynchronous resets may be replaced by synchronous resets to reduce design implementation costs and to reduce design implementation constraints. Additionally, various embodiments of the present disclosure relate to FPGA architecture consisting of individual functional elements that are optimized to omit asynchronous sequential inputs. The architecture is further augmented with multiple area-efficient system reset controllers that restore the omitted functionality. Additionally, the architecture includes other structures that make various logic units in the architecture useful within user designs originally specified to use asynchronous resets.

Devices that include one or more embodiments of the present disclosure may take any suitable form, such as application specific integrated circuits, electrically programmable and mask-programmable programmable logic device integrated circuits, digital signal processors, microprocessors, microcontrollers, and memory chips. If desired, various circuitry of the present disclosure may be used in programmable integrated circuits that are not traditionally referred to as programmable logic devices such as microprocessors containing programmable logic, digital signal processors containing programmable logic, custom integrated circuits containing regions of programmable logic, or other programmable integrated circuits that contain programmable logic.

Example Embodiments

Embodiments of the present disclosure are described herein in connection with various specific devices, circuits, applications, etc. However, these references are for purposes of illustration only and are not intended to limit the present disclosure in any way. For example, one or more embodiments of the present disclosure will be explained using programmable logic devices (PLDs) and technologies related thereto to illustrate the present disclosure. However, the present disclosure is widely applicable to other devices and in other environments. Moreover, embodiments of the present disclosure may be used in a wide variety of functions and/or applications.

Embodiments of the present disclosure may be utilized in relation to any device that includes memory devices or arrays. One example is a programmable logic device (PLD). PLD's are integrated circuits that can be configured by a user to perform custom logic functions. PLD's also generally contain a number of memory devices that can also be configured by a user to facilitate operation of custom logic circuitry. Although embodiments of the present disclosure may be used in the context of any integrated circuit that has circuitry that can be configured by a user to perform a custom function, certain embodiments of the present disclosure are described in the context of programmable logic devices for clarity.

An illustrative integrated circuit of the type that may contain circuitry for replacing asynchronous resets with synchronous devices is shown in FIG. 1. As shown, integrated circuit 10 takes the form of a programmable logic device (PLD) integrated circuit having input/output circuitry 12 for driving signals off of device 10 and for receiving signals from other devices via input/output pins 14. Pins 14 may be any suitable types of pins or solder bumps for making electrical connections between the internal circuitry of device 10 and external packaging. Some of the pins 14 may be used for high-speed communications signals. Other pins may be used to provide power supply voltages to the device 10 or may be used for DC or low-frequency signals.

Interconnection resources 16, such as global and local vertical and horizontal conductive lines and busses, may be arranged to route signals on device 10. Interconnection resources 16 may include conductive lines and programmable connections between respective conductive lines and are, therefore, sometimes referred to as programmable interconnects 16.

Programmable logic device 10 may contain programmable logic 18 and memory blocks 22. The programmable logic device 10 may also include (not shown) regions of digital signal processing circuitry, processors, hardwired circuits for supporting complex communications and arithmetic functions, etc. Programmable logic 18 may also include combinational and sequential logic circuitry including logic gates, multiplexers, switches, memory blocks, look-up-tables, logic arrays, and sequential logic circuitry, etc. These illustrative components are not mutually exclusive. For example, look-up tables and other components that include logic gates and switching circuitry can be formed using multiplexers. The programmable logic 18 may be arranged to perform one or more custom logic functions. The programmable interconnects 16 may be considered to be a type of programmable logic 18.

Some of the logic of programmable logic device is fixed (hardwired). The programmable logic in device 10 includes components that may be configured so that device 10 performs a desired custom logic function. The programmable logic in programmable logic device 10 may be based on any suitable programmable technology.

Programmable logic device 10 of FIG. 1 contains programmable memory elements 20, which can be loaded with configuration data (also called programming data) using pins 14 and input/output circuitry 12. Once loaded, the memory elements may each provide a corresponding static control output signal that controls the state of an associated logic component in programmable logic 18.

Memory elements 20 may use any suitable volatile and/or non-volatile memory structures such as random-access-memory (RAM) cells (e.g., CRAM or SRAM), fuses, antifuses, programmable read-only-memory memory cells, mask-programmed and laser-programmed structures, etc. Configurable memory elements 20 can be loaded with configuration data during programming. Mask-programmed programmable logic devices, which are sometimes referred to as structured application specific integrated circuits, are programmed by using lithographic masks to create a custom pattern of connections in an array of vias based on configuration data.

Memory arrays 22 may contain rows and columns of volatile memory elements such as random-access-memory (RAM) cells. The memory arrays 22 can be used to store data signals during normal operation of device 10. The memory arrays 22 do not have to have the same size. For example, small, medium, and large memory arrays 22 may be included on the same programmable logic device. The memory arrays 22 may, for example, include hundreds of small memory arrays that each has a capacity of about 512 bits, 2-9 large memory arrays that each has a capacity of about half of a megabit, and an intermediate number of medium size memory arrays that each has a capacity of about 4 kilobits. These are merely illustrative memory array sizes and quantities. In general, there may be any suitable size and number of memory devices or arrays 22 on device 10. There may also be any suitable number of regions of programmable logic 18.

During user mode, memory elements 20 are generally loaded with configuration data from an external configuration device via pins 14 and input/output circuitry 12. The outputs of the loaded memory elements 20 are applied to the gates of metal-oxide-semiconductor transistors in programmable logic 18 to turn certain transistors on or off and thereby configure the logic in programmable logic 18. Programmable logic circuit elements that may be controlled in this way include pass transistors, parts of multiplexers (e.g., multiplexers used for forming routing paths in programmable interconnects 16), look-up tables, logic arrays, AND, OR, NAND, and NOR logic gates, etc.

The circuitry of device 10 may be organized using any suitable architecture. As an example, the logic of programmable logic device 10 may be organized in a series of rows and columns of larger programmable logic regions each of which contains multiple smaller logic regions. The resources of device 10, such as programmable logic 18 and memory 22, may be interconnected by programmable interconnects 16. Interconnects 16 generally include vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Still other device arrangements may use logic that is not arranged in rows and columns.

In addition to the relatively large blocks of programmable logic that are shown in FIG. 1, device 10 generally also includes some programmable logic associated with the programmable interconnects, memory, and input-output circuitry on device 10. For example, input-output circuitry 12 may contain programmable input and output buffers. Interconnects 16 may be programmed to route signals to a desired destination.

Figure 2:
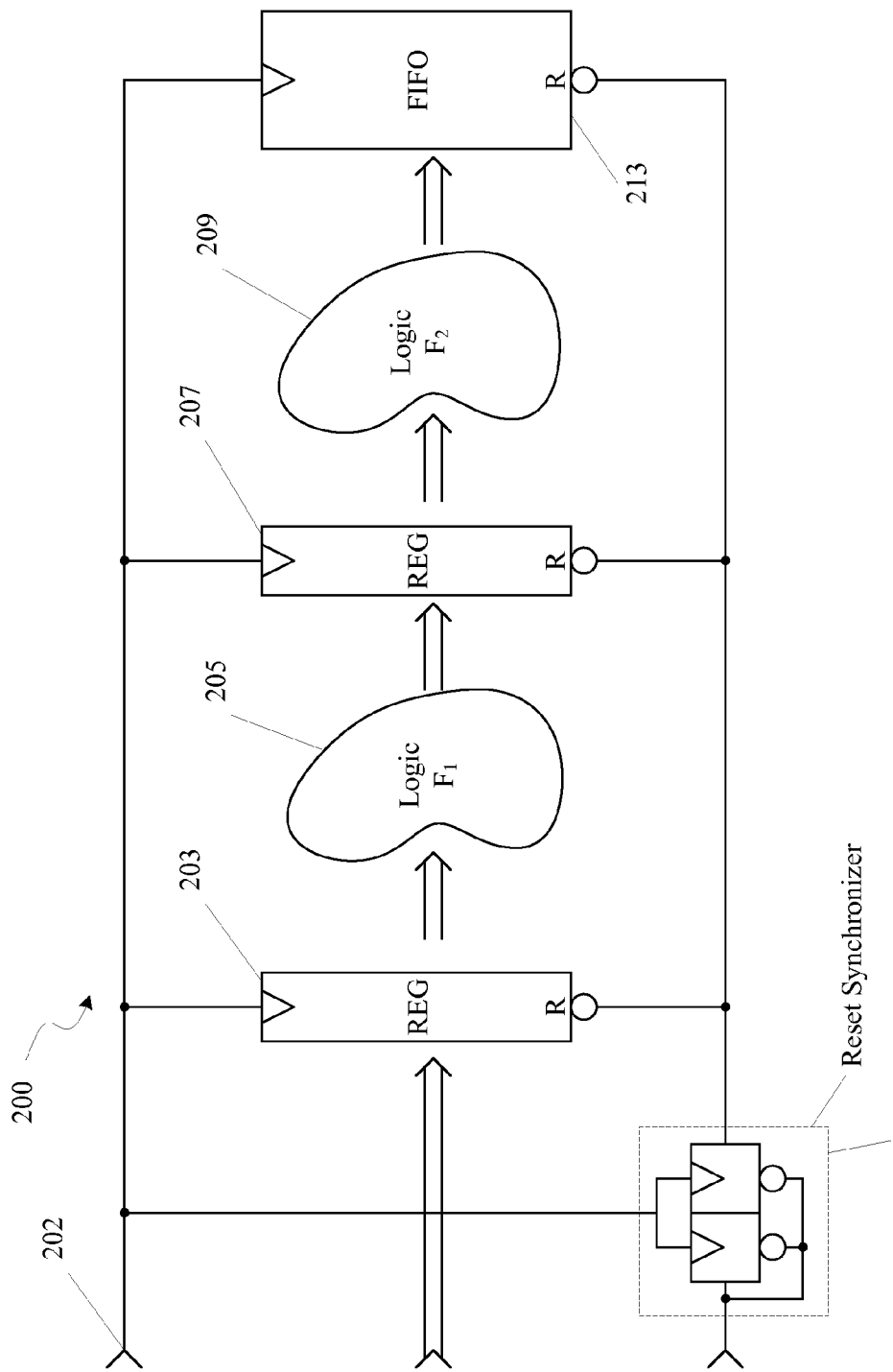
FIG. 2 is a diagrammatic representation of asynchronous reset use in a pipelined data-path of a circuit, in accordance with various embodiments of the present disclosure.

FIG. 2 depicts an example data-path circuit 200 with asynchronous resets. In some embodiments, this could be part of any type of asynchronous system. In some embodiments, circuit 200 could be part of any synchronous machine if feedback paths were added. Data-path circuit 200 includes a root clock 202 distributed throughout circuit 200. In some embodiments, root clock 202 is distributed from a PLL clock generator. In some implementations, the root clock 202 is generated up stream and processed/conditioned (phase changed and/or frequency synthesized) before reaching circuit 200. In various embodiments, circuit 200 includes a double-flop reset synchronizer 201, and several pipeline registers 203 and 207 in-between clouds of logic 205 and 209. In some embodiments, "hardened" synchronous blocks could be included. In some implementations, "hardened" or "hard" synchronous blocks refers to programmable logic components such as IOs, memories, and DSP blocks. Circuit 200 includes a hardened synchronous component FIFO 213. The output of the reset synchronizer 201 is fed to all the pipeline registers, as well as any synchronous blocks requiring it as well. In some embodiments, circuit 200 could include feedback paths as mentioned above. In some embodiments, multiple clocks, multiple reset signals, and/or multiple hardened blocks can also be included in circuit 200.

A reset use as in circuit 200 might include several costs. For example, one cost of this approach can be seen in the overall initialization of the data-path machine. In particular, the reset signal must be distributed to every synchronous sequential element in the design, which requires that these elements must contain additional logic to respond appropriately to the reset signal. However, FIG. 3 presents one exemplary design around to this problem.

Figure 3:
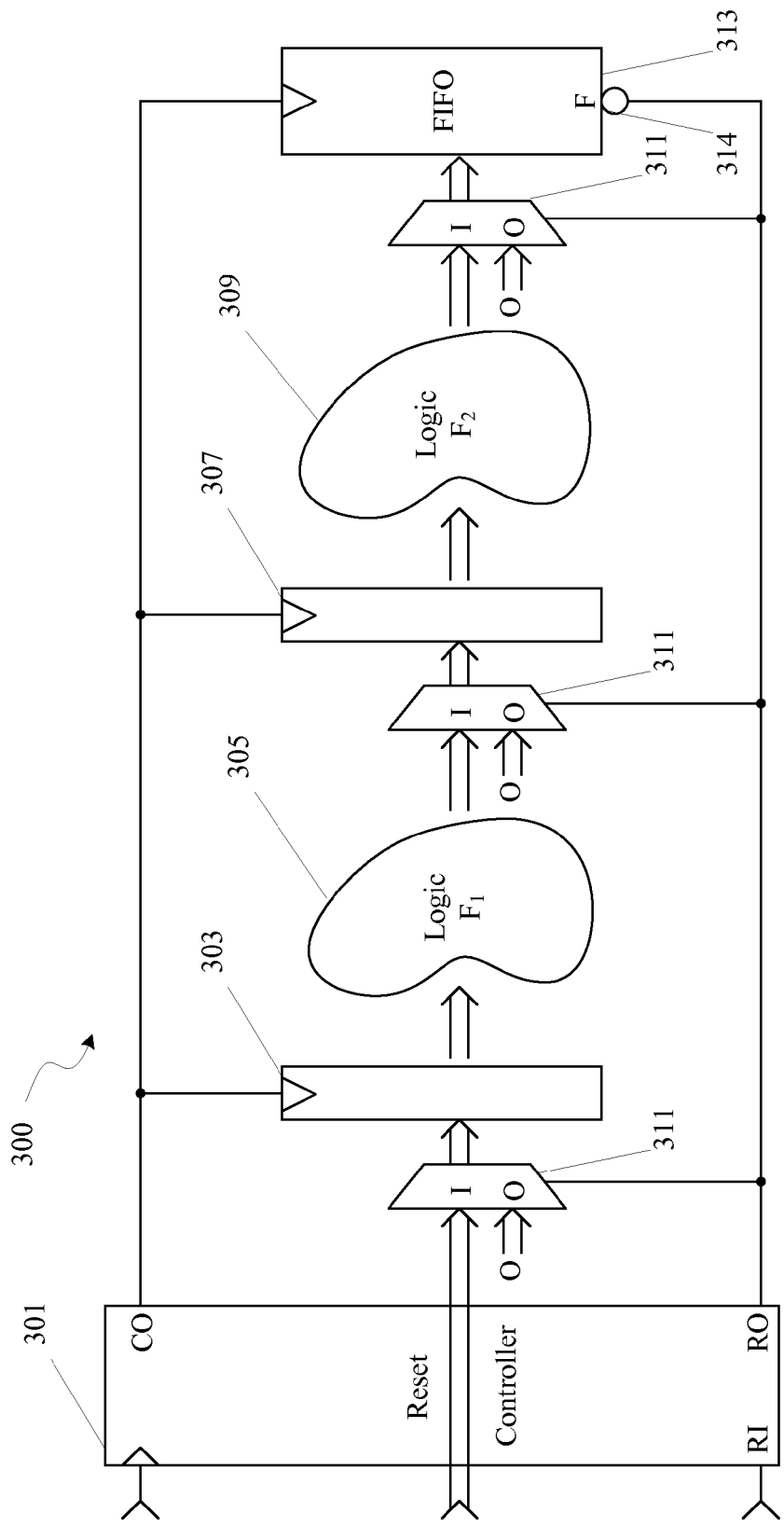
FIG. 3 illustrates a circuit with asynchronous resets converted to synchronous resets, in accordance with various embodiments of the present disclosure.

FIG. 3 depicts an example circuit 300, which is a variant on example circuit 200. Circuit 300 is essentially the same as circuit 200 except that asynchronous resets on registers 203 and 207 inside the core design have been replaced by multiplexors 311 before the registers 303 and 307, which consequently force their inputs to zero. For example, in FIG. 3, the internal reset signals distributed from the RO pin of controller 301 are routed to the select input buses, shown on the bottom of multiplexors 311. Each multiplexor 311 has two input buses on the left, with the data path signal on one pin and a "0" value on the other pin. A reset would cause or force the inputs to the register to be "0" instead of the data path signal. The replacement of the asynchronous resets with the multiplexors implements a synchronous reset function to circuit 300. In some embodiments, logic clouds 305 and 309 are unchanged. In some implementations, this replacement technique may also be done before hardened synchronous blocks. For example, in FIG. 3, FIFO 313 has a multiplexor 311 replacing the asynchronous reset found on FIFO 213 of FIG. 2. In some embodiments, the hardened blocks may retain an asynchronous input if additional side-effects are required, such as demonstrated with asynchronous input "flush" pin 314 of FIFO 313 in FIG. 3.

In addition to replacing the asynchronous resets pins in the registers with multiplexors, the reset synchronizer 201 of FIG. 2, has been replaced by an integrated system reset controller 301 in circuit 300. In some embodiments, the reset controller 301 modifies and distributes the externally-supplied clock (">" pin) and reset ("RI" pin) signals such that the internal clock ("CO" pin) and reset ("RO" pin) signals, when applied to internal components with synchronous resets, behave approximately the same as circuit 200 of FIG. 2 behaves when an asynchronous reset is applied and removed. Detailed descriptions of the contents of integrated system reset controller 301 are presented later on in the disclosure. In some embodiments, controller 301 does not connect to the data path, but rather only interrupts the clock and reset signals. In other embodiments, controller 301 does connect to the data path, as long as the controller interrupts and modifies the clock and reset signals.

In various embodiments, there are several advantages to replacing asynchronous reset logic inside each register and synchronous block with a preceding multiplexor. One, multiplexors can be merged into preceding logic, possibly at low cost. Second, when the modified circuit is subject to retiming there will be no retiming constraints created by the presence of asynchronous resets. In various embodiments, retiming is a technique of moving the structural location of latches or registers in a circuit to improve its performance, area, and/or power characteristics in such a way that preserves its functional behavior at its outputs.

Figure 4:
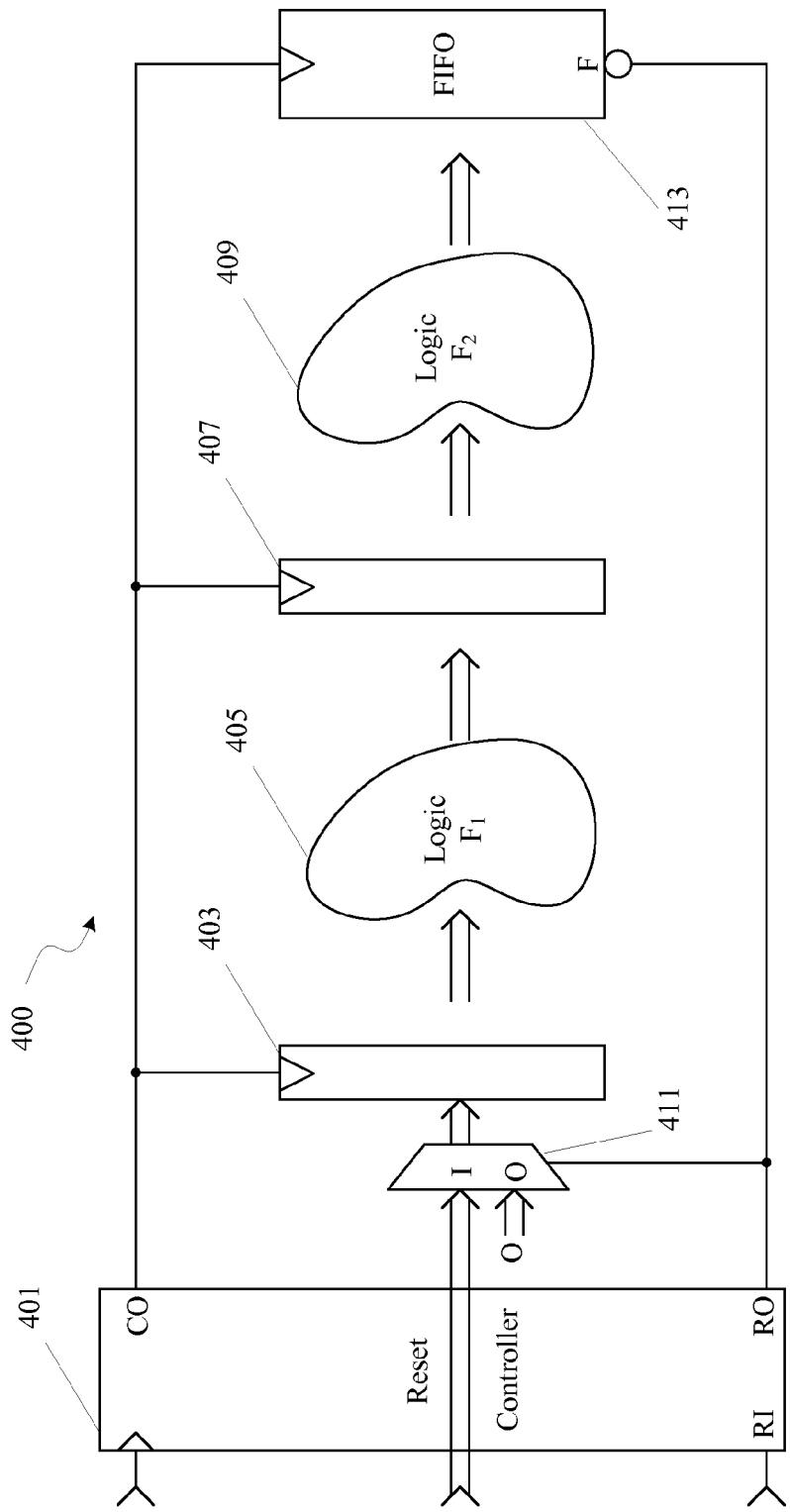
FIG. 4 illustrates an example of an optimized circuit with simplification of synchronous resets, in accordance with various embodiments of the present disclosure.

FIG. 4 illustrates an additional advantage of using a system reset controller. More specifically, FIG. 4 illustrates an example of an optimized circuit with simplification of synchronous resets. In various embodiments, the sequential structure of a circuit allows for simplification and optimization. For example, circuit 400 is an example of a simplified version of circuit 300 of FIG. 3. In FIG. 4, instead of a multiplexor in front of each register and synchronous block, circuit 400 only depicts one multiplexor 411 in front of register 403. Circuit 400 still maintains a system reset controller 401. Note that because of the sequential nature of the circuit, placing the multiplexor in front of the first register (403) in the circuit provides for the same result of circuit 300 in FIG. 4, under certain conditions. For example, in some embodiments, one condition can be when the controller in circuit 400 holds a reset signal for a greater number of clock cycles than the controller in circuit 300. In some embodiments, another condition can be when the amount of time that a reset signal is held is dependent upon the number of registers in downstream data paths. In these embodiments, under such conditions, placing a single multiplexor in front of register 403 will allow circuit 400 to provide the same result as circuit 300. This is because if a reset signal is held for at least a certain amount of time, then the reset and the output of the first register can be used as input to the second register, hence resetting the second register. The amount of time for holding the reset signal depends upon the number of registers in the circuit and the number of multiplexors removed (when modifying circuit 300 to circuit 400). In some embodiments, circuit 400 can have more than one multiplexor 411, as long as the sequential nature of the circuit allows for downstream propagation of signals from multiplexors. The following example illustrates one advantage of an optimized circuit, in accordance with various embodiments of the present disclosure.

In some embodiments, a synchronous reset needs at least one clock to function properly. In one example, if the system reset controller 401 guarantees in circuit 300 that the synchronous reset will always be asserted for at least 3 adjacent clock pulses, then during the final reset cycle the input to each register will be known (with each clock cycle, the next register in the data path will be reset) and the logic implementing the multiplexor can possibly be simplified even further, as shown in FIG. 4. Each logic cloud in original circuit 300 is simply wired straight through and reset will cause them all to be zero. In modified circuit 400, this behavior can be captured with a single multiplexor 411 before the entire datapath, as well as a guarantee that any reset sequence will contain at least three clock pulses.

Note, in the example, that the extent (number of clock periods) of this guarantee depends on the depth of the data-path, the placement of resets, and the level of optimization desired. Since all these details are fully known only inside the design software which maps the design onto the silicon, the number of clock periods should be "back-annotated" into a design file as a result of this mapping process. The contents of this file will determine the cycle-by-cycle details of the full sequential reset process. Since designs typically focus on (a) what happens exactly during each normal clock cycle and (b) what values all sequential components contain upon exit from reset, but not (c) what happens during reset, a slight modification to a designer's intent should be manageable.

Figure 5:
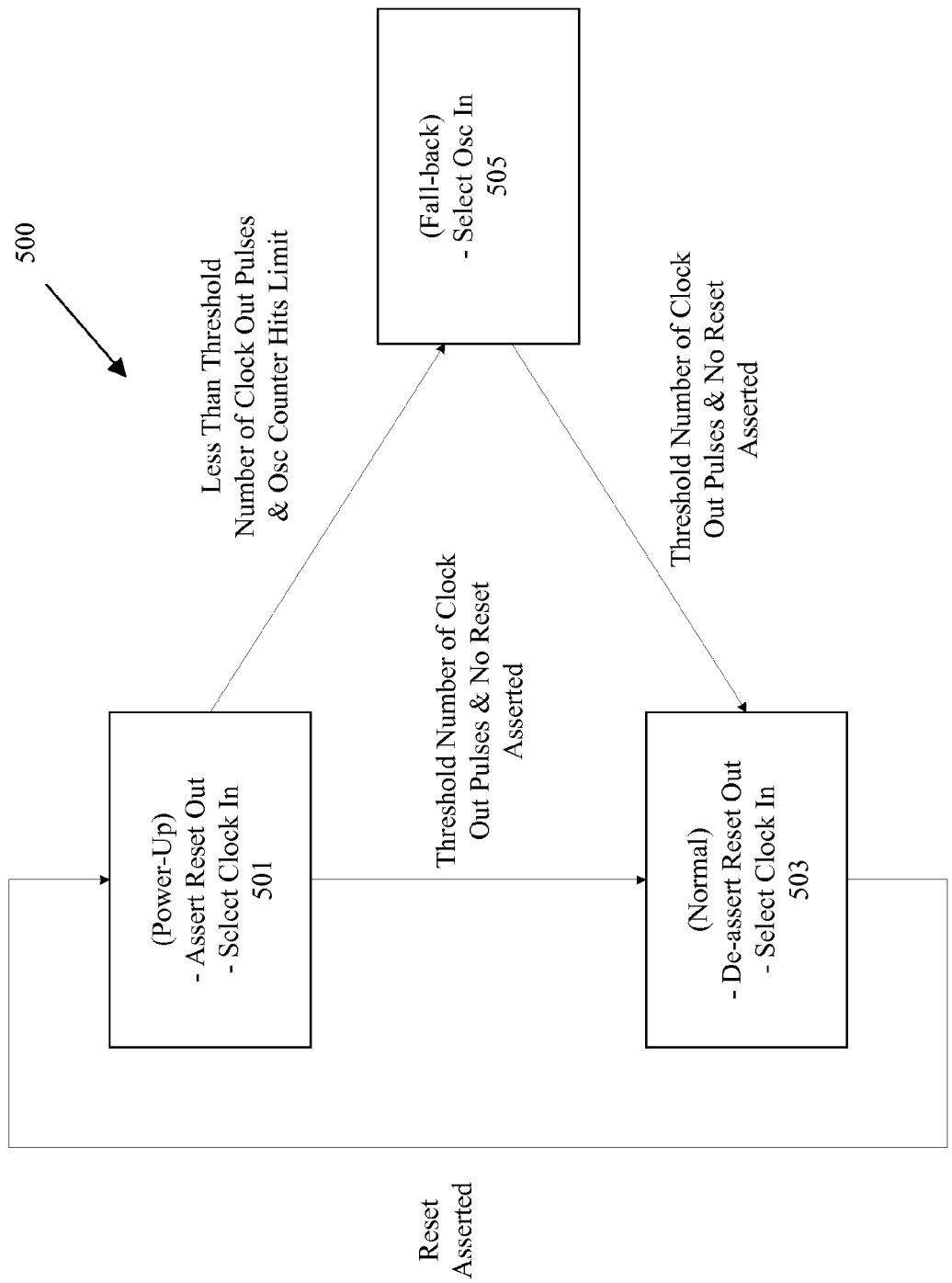
FIG. 5 is a flow chart depicting different transition states of a system reset controller, in accordance with various embodiments of the present disclosure.

FIG. 5 is a flow chart 500 depicting different transition states of an example system reset controller, such as controller 301 or 401. An example reset controller, such as controller 301 or 401, alternates between 3 major states. One state is the power-up state 501. This state occurs when the circuit (300 or 400) or the device upon which the circuit exists initializes upon power-up. In some embodiments, power-up state 501 is also the primary reset state. Upon power-up, reset out is asserted. In addition, clock in is selected to clock out. In some embodiments, an internal oscillator is started and the number of oscillator pulses is counted. In various embodiments, the clock out pulses are counted. If a threshold number of clock out pulses has been counted and reset input has not been asserted, then the system reset controller goes into normal operation state 503. In some embodiments, the threshold number of clock out pulses is a predetermined number that can be adjusted and can be stored in RAM in the controller. In other embodiments, this threshold number cannot be adjusted.

If a threshold number of clock out pulses has been counted and reset input is not asserted, then system controller 301 or 401 moves into normal operation state 503. In normal operation state 503, reset out is de-asserted and clock input is selected to clock out. If reset input is asserted, then the system reset controller moves back to the power-up or primary reset state 501, as described above. In other words, if the system triggers a reset, the controller goes back to the original start-up state.

If, while in power-up state 501, a threshold number of clock out pulses has not been counted and a threshold number of oscillator pulses has been counted, then system reset controller 301 or 401 moves into fall-back reset state 505. In some embodiments, as with counting the clock out pulses, the oscillator pulse threshold count is a predetermined number that can be adjusted. In other embodiments, the oscillator pulse threshold count cannot be adjusted. In some embodiments, the threshold number of oscillator pulses can be different from the threshold number of clock out pulses. In fall-back state 505, oscillator out is selected to clock out. As with power-up state 501, if a threshold number of clock out pulses has been counted and reset input is not asserted, then the system reset controller 301 or 401 moves to normal operation state 503.

In various embodiments, the controller facilitates the replacement of asynchronous resets by synchronous resets through-out the body of the design. In such embodiments, synchronous resets require clock pulses in order to function properly. Thus, the controller contains an internal oscillator for two reasons. One, the oscillator clocks a time-out counter that determines if too much time has passed since the onset of reset before an external clock pulse has arrived. Two, the oscillator provides the system clock pulses in the absence of external clock pulses. In some embodiments, if this fail-safe behavior is not needed, then the oscillator is not needed. In such embodiments, the oscillator and clock multiplexor, as described later in FIG. 6, can be removed.

Figure 6:
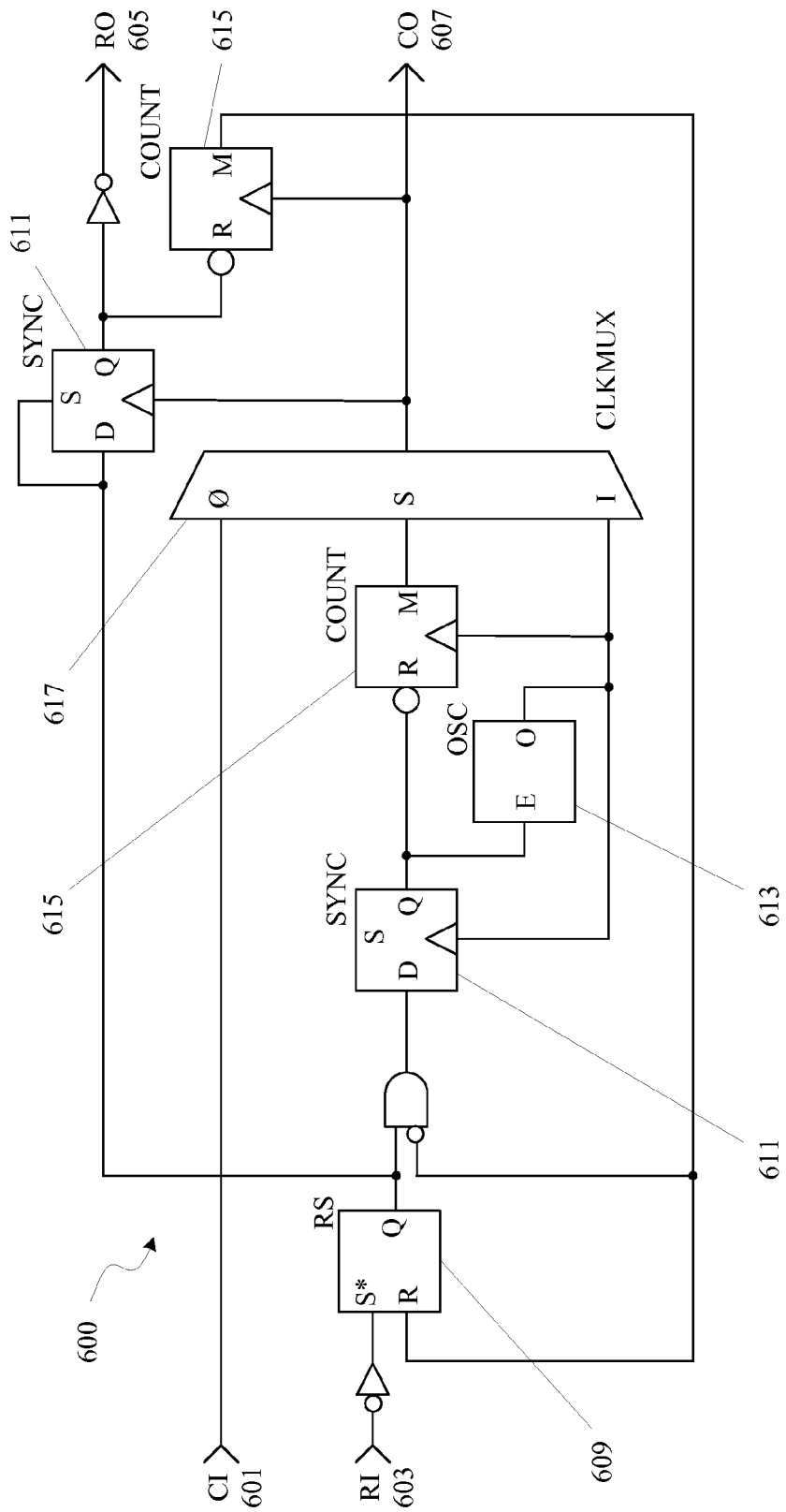
FIG. 6 illustrates an example implementation of a system reset controller, in accordance with various embodiments of the present disclosure.

FIG. 6 illustrates an example implementation of a system reset controller 600, in accordance with various embodiments of the present disclosure. System reset controller 600 can be used to implement controller 301 or 401 in FIGS. 3 and 4, respectively. FIGS. 7A-7E illustrate example detailed implementations of some basic logic components and circuits found in system reset controller 600. Circuit 600 includes some basic logic components that are well known in the art, such as inverters and basic AND gates. Circuit 600 also includes other circuit components, such as RS flip flop 609, synchronizer 611, oscillator 613, counter 615, and clock multiplexor 617. As mentioned above, these circuit components are illustrated in more detail in FIGS. 7A-7E.

Figure 7A:
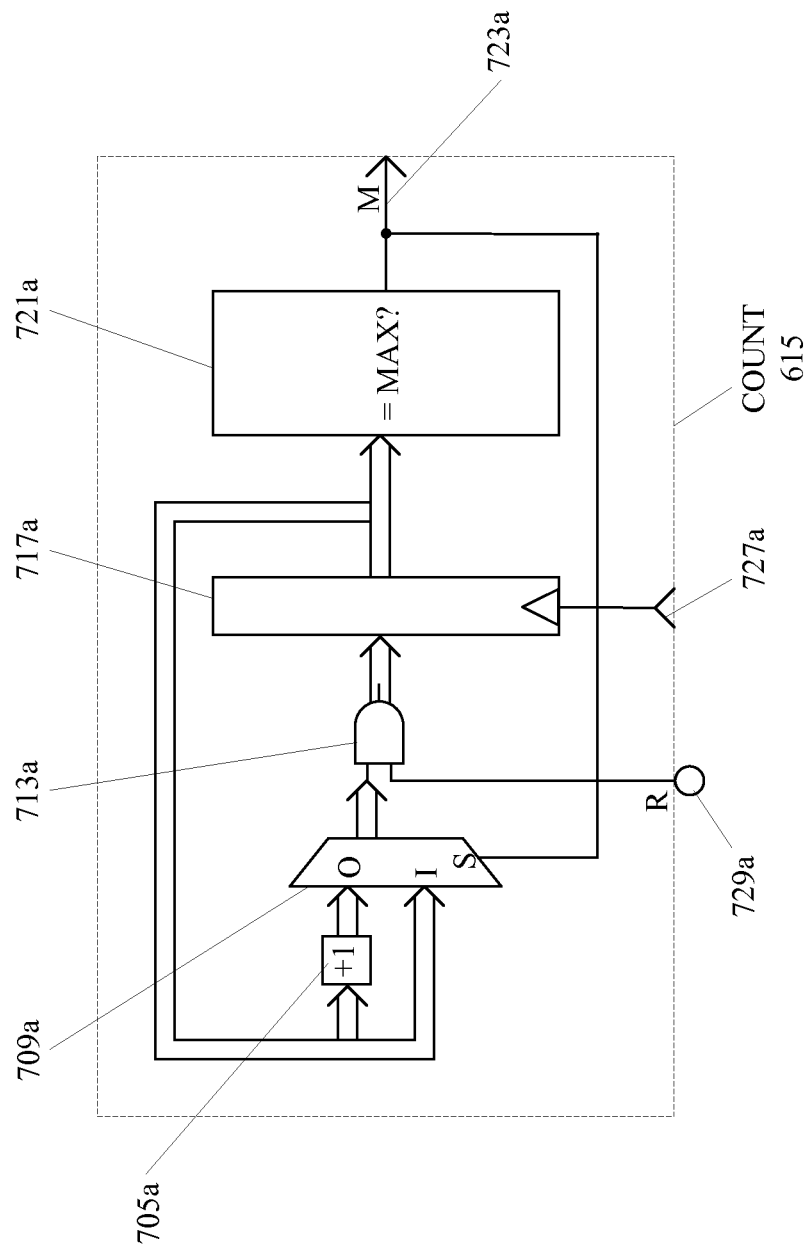
FIGS. 7A-7E illustrate different sub-components for an example implementation of a system reset controller, in accordance with various embodiments of the present disclosure.

FIG. 7A illustrates an example counter 615. As mentioned above and depicted in FIG. 6, counter 615 is used to count the number of clock out pulses as well as the number of oscillator pulses. Counter 615 contains a MAX logic element 721a. MAX logic element 721a determines if the count has reached the threshold value. If yes, then MAX logic element 721a outputs a "1." Otherwise, MAX logic element 721a outputs a "0." In some embodiments, MAX logic element 721a contains the threshold value for clock out pulses or oscillator pulses utilized for moving in between transition states 501, 503, and 505 in FIG. 5. Counter 615 also contains register 717a with clock input connected to clock input 727a. In addition, counter 615 includes adder 705a incrementing the output from register 717a. The output of register 717a is also fed into MAX 721a and looped back into multiplexor 709a, with the direct output going into the "1" input and the incremented output feeding into the "0"

input line of multiplexor 709a. Note that the R input feeds into AND gate 713a. Thus, in the example in FIG. 7A, if the value of R is "1," then AND gate 713a will pass the entire bus from multiplexor 709a as is. However, if R is "0," then the AND gate will pass the value as "0." Thus, counter 615 will count to the max unless there is a reset, in which case counter 615 will be reset to "0."

Figure 7B:
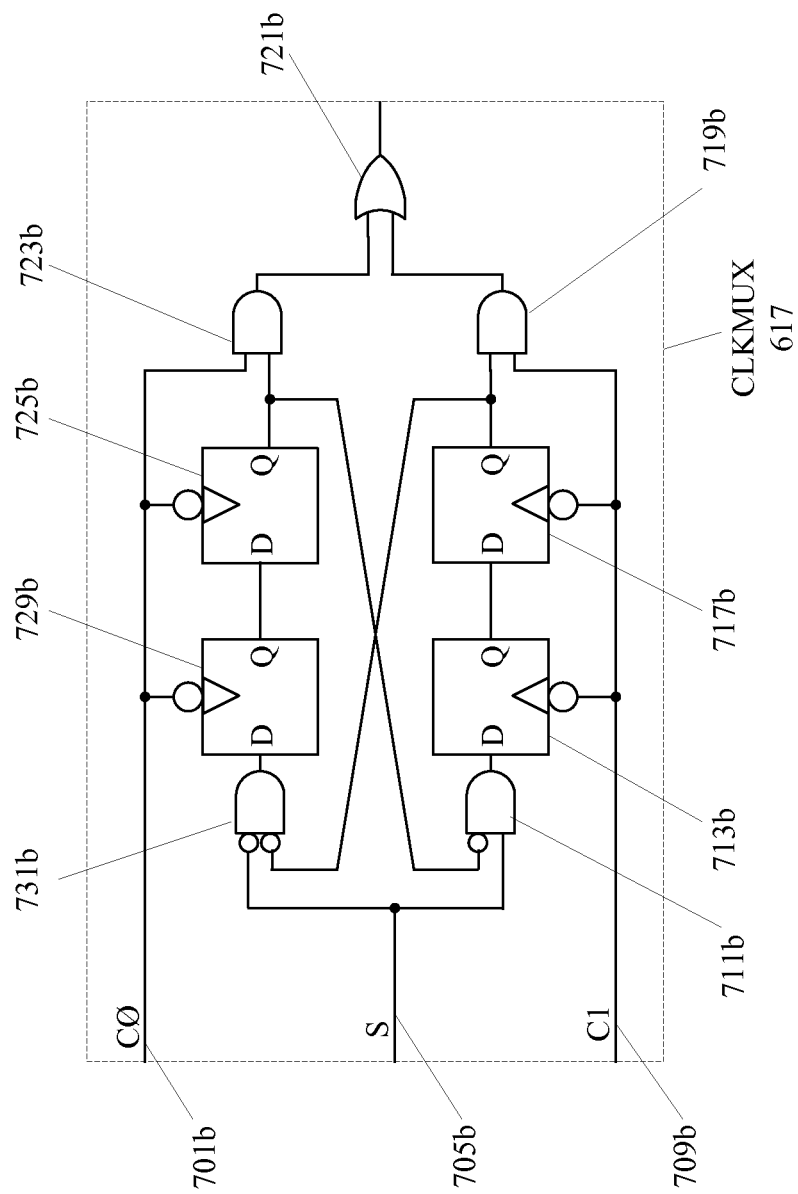

FIG. 7B illustrates an example clock multiplexor 617. As illustrated in FIG. 6, clock multiplexor 617 selects between clock in (CI) 601, connected to CO input 701b, and the output of oscillator 613, connected to C1 input 709b. Clock multiplexor 617 includes 4 AND gates 731b, 711b, 719b, and 723b. Clock multiplexor 617 also includes an OR gate 721b. In some embodiments, clock multiplexor 617 includes 4 flip flops 729b, 725b, 713b, and 717b, with bubbles indicating that the flip flops change on falling clock signals from clock inputs 701b and 709b.

Figure 7C:
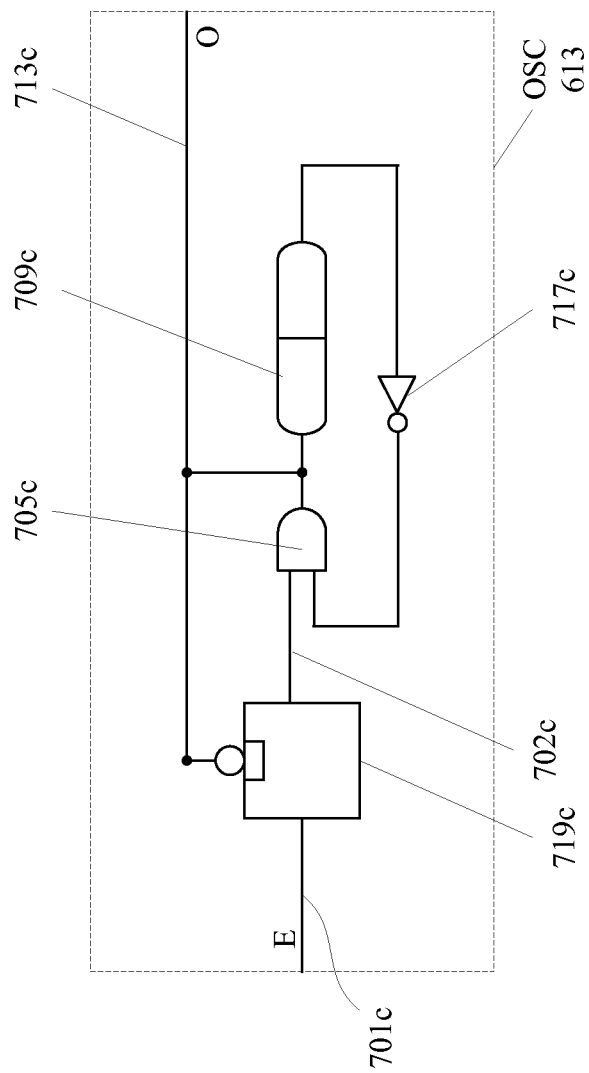

FIG. 7C illustrates an example oscillator 613. As mentioned above, oscillator 613 is used to determine if too much time has passed since the onset of reset before an external clock pulse has arrived and to provide the system clock pulses in the absence of external clock pulses. Oscillator 613 includes delay element 709c, which delays the output of AND gate 705c, from left to right, and feeds the delayed output to inverter 717c. Oscillator 613 also includes a latch 719c. If the oscillator signal value 713c is low, then input latch 719c translates the value on the enable line 701c to AND input line 702c. If the oscillator value 713c is high, then latch 719c remembers the last value and disregards the value on enable line 701c.

Figure 7D:
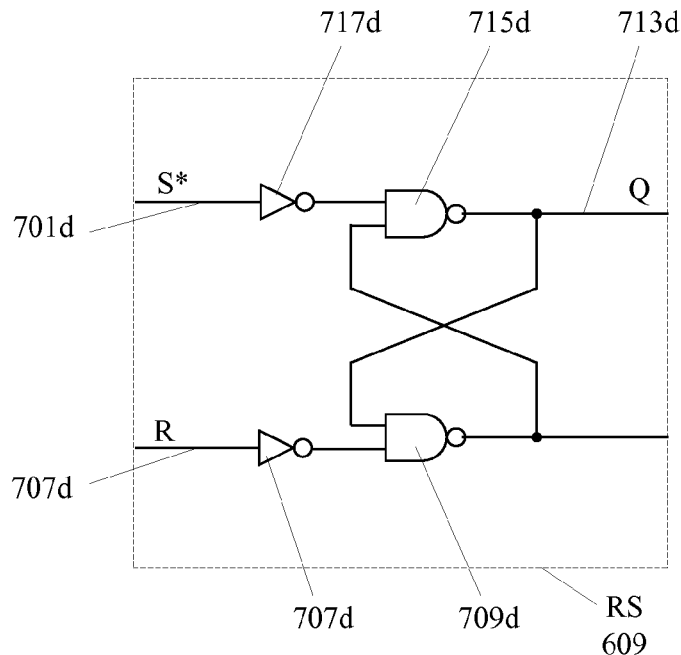

FIG. 7D illustrates an example reset-set (RS) flip flop 609. RS flip flop 609 is an example of a basic flip flop with two inverters (717d and 707d) and two AND gates (715d and 709d). In some embodiments, flip flops are utilized to store state information. It is important to note that RS flip flop 609 has an S* pin 701d and an R pin 707d. The S* pin 701d takes precedence over the R pin 707d if both the S* pin and the R pin are asserted simultaneously.

Figure 7E:
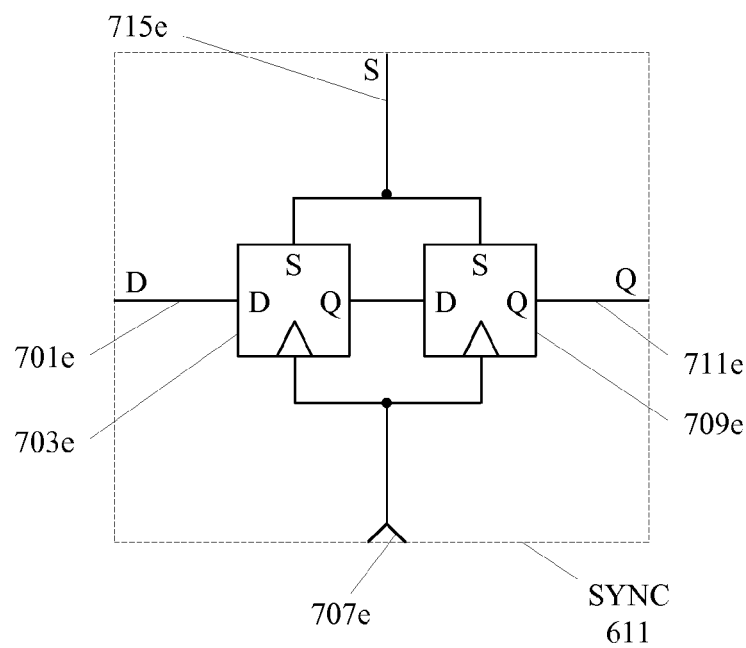

FIG. 7E illustrates an example synchronizer 611. In various embodiments, synchronizer 611 synchronizes the transitions from 1 to 0 and vice versa. Synchronizer 611 includes two flip flops (703e and 709e), a set pin 715e, a clock input 707e, a data input 701e, and an output 711e. In some embodiments, synchronizer 611 is a standard synchronizer with one or a chain of flip flops.

It is important to note that there are numerous variations and trivial modifications that can be made to each of these circuits and still be in accordance with the present disclosure, as long as their basic functions do not change. For example, clock multiplexor 617 in FIG. 7B could have fewer synchronizing flip-flops. Also, the left-most AND gates 731b and 711b could be moved partially forwards depending on synchronization needs. It is also important to note that these example circuits presented also omit the separate power-up initialization that may be needed for proper function.

Figure 8A:
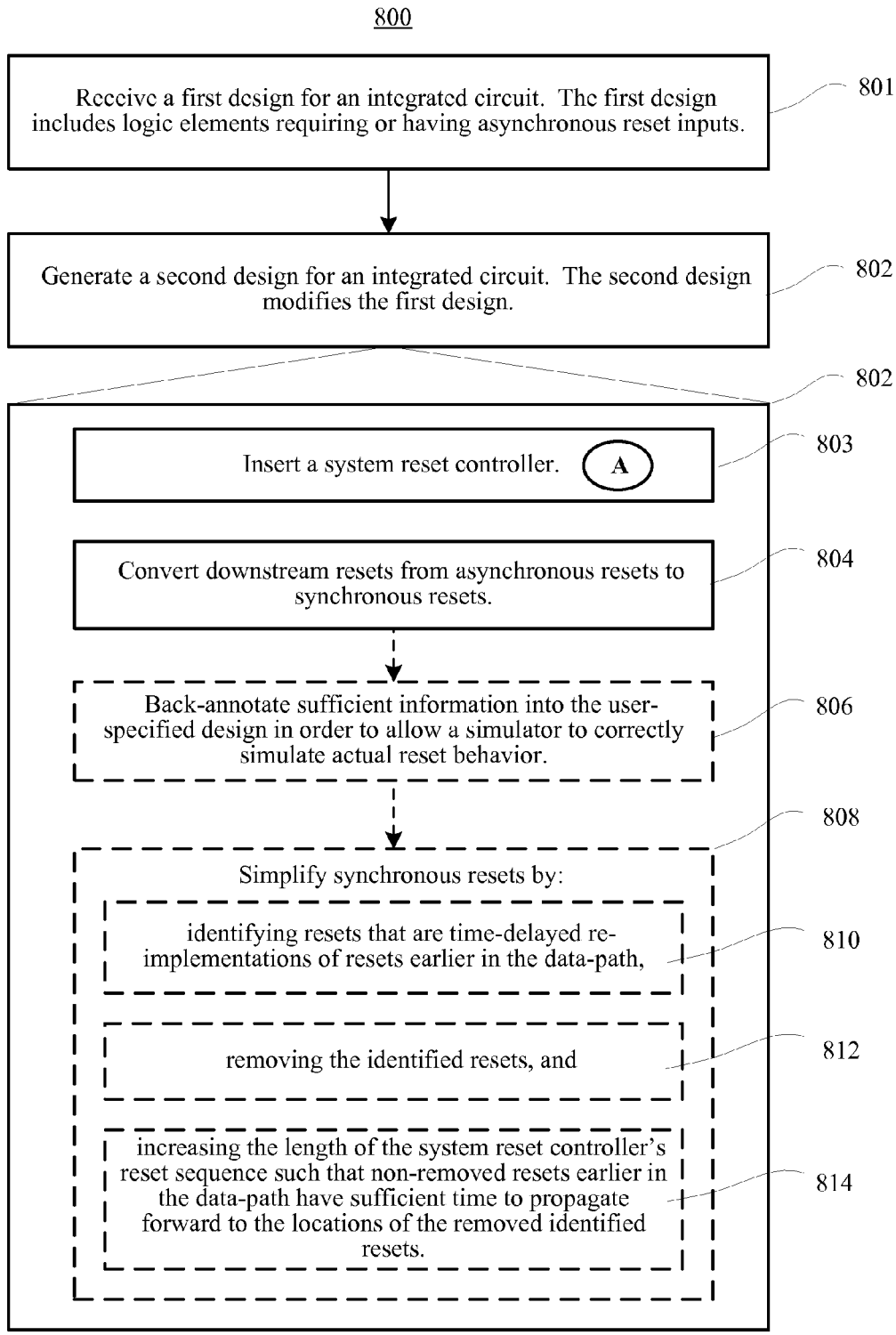
FIGS. 8A-8C depict a flow chart illustrating a procedure for modifying a user-specified design for an integrated circuit device, in accordance with various embodiments of the present disclosure.
Figure 8B:
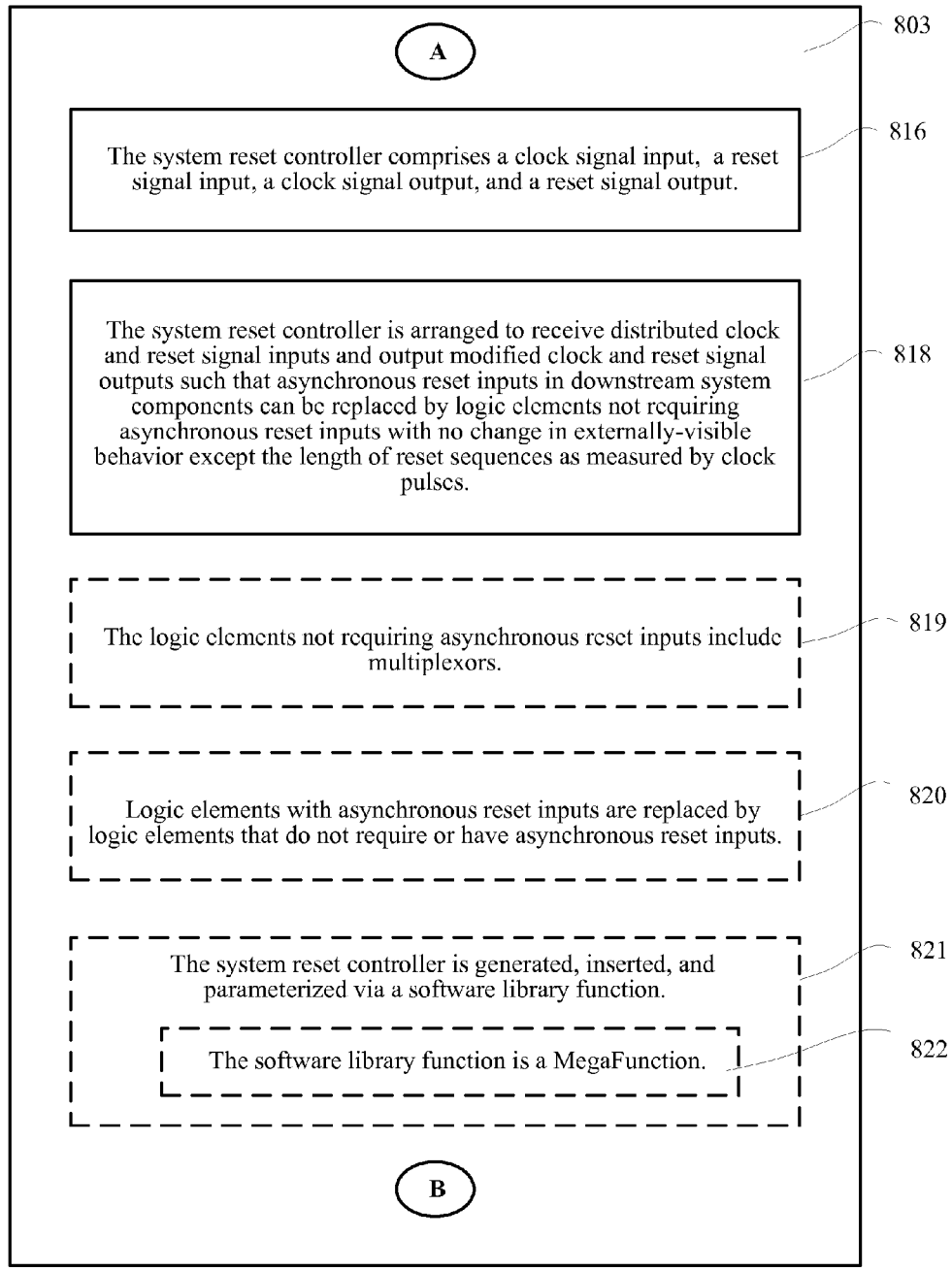
Figure 8C:
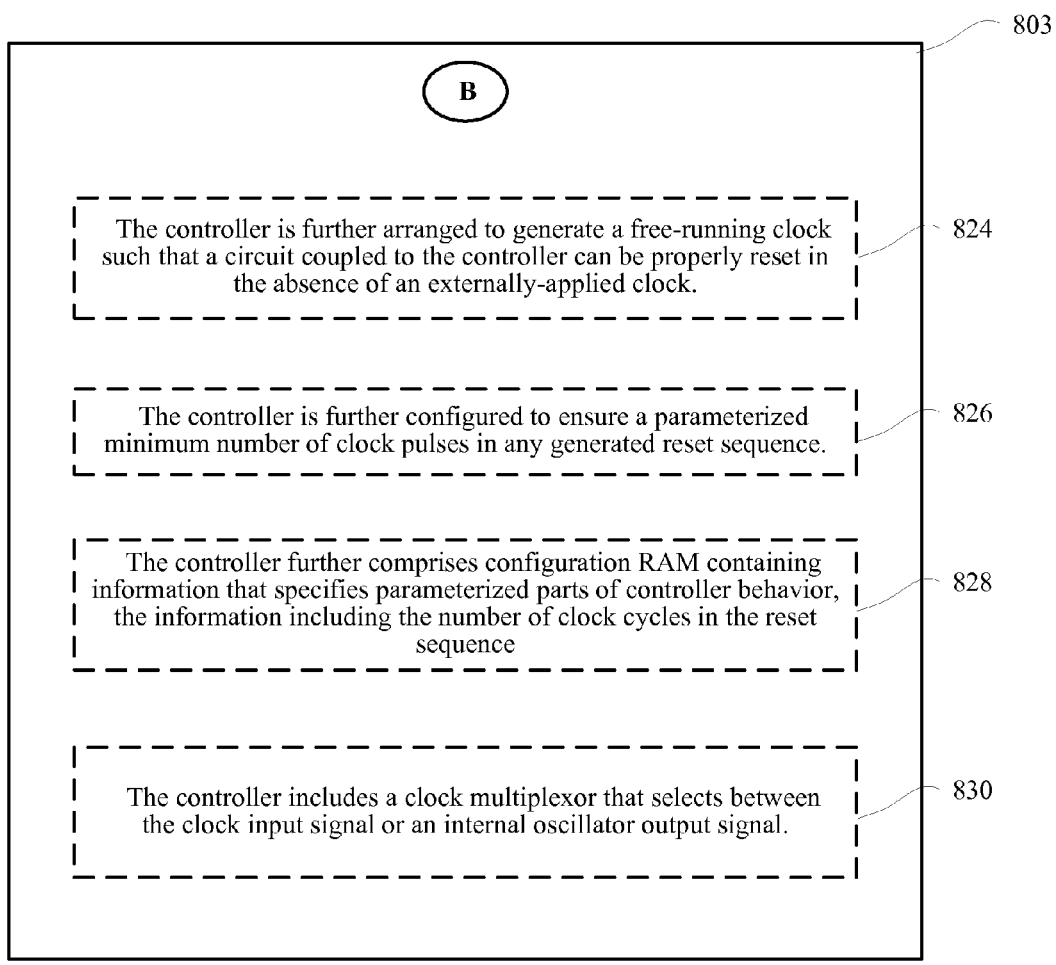

FIGS. 8A-8C illustrate a flow chart for a procedure 800 for modifying a user-specified design for an integrated circuit device in accordance with a specific implementation of the present disclosure. Initially, a first design for an integrated circuit is received (801). In some embodiments, the first design includes logic elements requiring or having asynchronous reset inputs. Next, a second design for an integrated circuit is generated (802). In some embodiments, the second design modifies the first design. In various embodiments, the second design includes inserting (803) a system reset controller into a data path circuit. Mechanisms for implementing a device based on logic design information are further described herein. Next, the second design includes converting (804) downstream resets from asynchronous resets to synchronous resets. Examples of this conversion are demonstrated in FIGS. 3 and 4. In some embodiments, the second design also includes back-annotating (806) sufficient information into the user-specified design in order to allow a simulator to correctly simulate actual reset behavior. In such embodiments, this is accomplished through design software arranged to program system reset controllers. In some implementations, such software is also arranged to program the desired number of reset clock cycles into a system reset controller. In various embodiments, the second design also includes simplifying (808) synchronous resets by identifying (810) resets that are time-delayed re-implementations of resets earlier in the data path, removing (812) the identified resets, and increasing (814) the length of the system reset controller's reset sequence such that non-removed resets earlier in the data-path have sufficient time to propagate forward to the locations of the removed identified resets.

In some embodiments, the system reset controller comprises (816) a clock signal input, a reset signal input, a clock signal output, and a reset signal output. For example, as shown in FIG. 3, system reset controller 301 includes a clock in pin, a clock out (CO) pin, a reset in (RI) pin, and a reset out (RO) pin. In various embodiments, the system reset controller is configured (818) to receive distributed clock and reset signal inputs and output modified clock and reset signal outputs such that asynchronous reset inputs in downstream system components can be replaced by synchronous reset inputs with no change in externally-visible behavior except the length of reset sequences as measured by clock pulses. For example, in some embodiments, circuit 300 in FIG. 3 should behave the same as circuit 200 in FIG. 2. In some embodiments, the logic elements not requiring asynchronous reset inputs include (819) multiplexors. In some embodiments, logic elements with asynchronous reset inputs are replaced (820) by logic elements that do not require or have asynchronous reset inputs.

In some embodiments, the system reset controller is generated, inserted, and parameterized (821) via a software library function. In some implementations, the software library function is (822) a "MegaFunction." In various embodiments, the configuration of the system reset controller may be specified according to a "MegaFunction" or library function which allows instantiation of the system reset controller. A MegaFunction refers to one or more of a (1) user interface, (2) software, and (3) supporting implementation, to describe an ability for a user of a device to use one or more functionalities of the device in a flexible, parameterized way. The supporting MegaFunction implementation may include supporting soft logic and/or hard logic. The intervening MegaFunction software may determine how to implement the parameters supplied by the user, while running the MegaFunction user interface. For example, the MegaFunction software may determine how the user-supplied parameters get translated to changes in the soft logic, and/or to settings in the hard logic. In some embodiments, the MegaFunction implementation logic is generated by a graphical user interface, variously referred to as "wizard", "plug-in", "MegaWizard Plug-In Manager" or similar terminology.

In some embodiments, the controller is further arranged (824) to generate a free-running clock such that a circuit coupled to the controller can be properly reset in the absence of an externally-applied clock. For example, FIG. 6 depicts the system reset controller 600 containing an oscillator 613, which can function as a free-running clock in the absence of an externally applied clock in signal 601. In some embodiments, the controller is further configured (826) to ensure a parameterized minimum number of clock pulses in any generated reset sequence. As mentioned above, the guaranteed minimum number of clock pulses allows for further optimization and simplification of synchronous reset replacement, as illustrated in FIG. 4. In some embodiments, the controller further comprises (828) configuration RAM containing information that specifies parameterized parts of controller behavior. In such embodiments, the information includes the number of clock cycles in the reset sequence. This allows for the controller to be programmed and reprogrammed. In some embodiments, the system reset controller includes (830) a clock multiplexor that selects between the clock input signal or an internal oscillator output signal.

All or some of the operations for adding a system reset controller and replacing asynchronous resets with synchronous resets may be performed to all or some of the operations described above. The order does not matter since the order of adding a system reset controller and replacement of the asynchronous resets does not affect the overall structure of the modified circuits.

Figure 9:
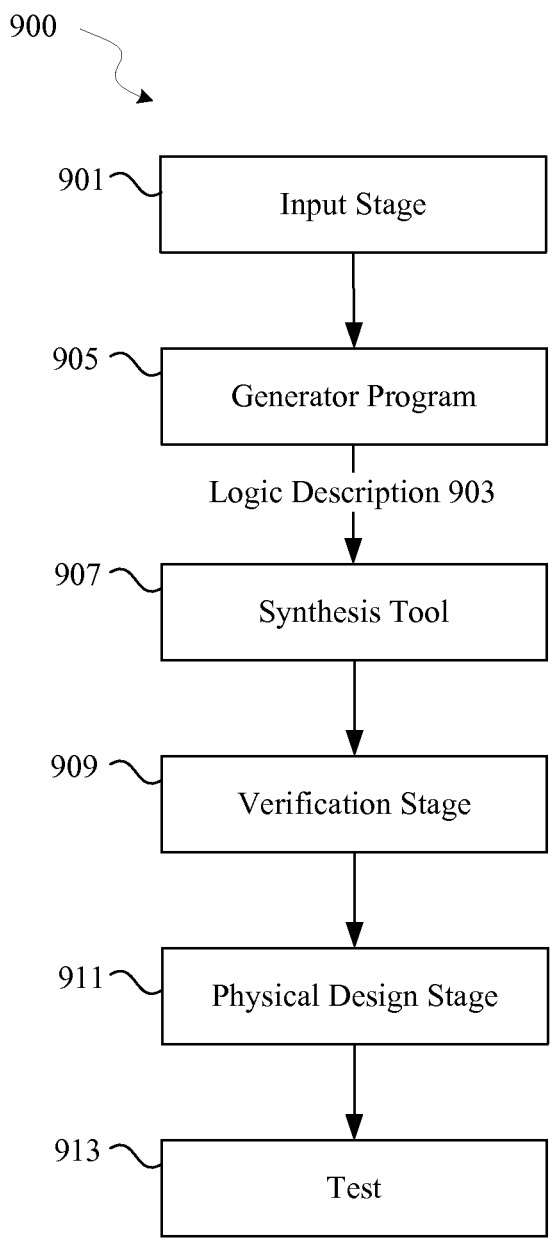
FIG. 9 illustrates an exemplary technique for implementing a programmable chip, in accordance with various embodiments of the present disclosure.

Although the techniques and mechanisms of the present disclosure can be used on a variety of devices such as ASICs, ASSPs, controllers, processors, etc., one particular example of a device that can implement a system reset controller is a programmable chip. Programmable chips have a number of logic elements that operate in different clock domains. FIG. 9 is a diagrammatic representation showing implementation of a programmable chip. An input stage 901 receives selection information typically from a user for logic to be implemented on an electronic device. In one example, the input received is in the form of a high-level language program. A generator program 905 creates a logic description and provides the logic description 903 along with other customized logic to any of a variety of synthesis tools, place and route programs, and logic configuration tools to allow a logic description to be implemented on an electronic device.

In one example, an input stage 901 often allows selection and parameterization of components to be used on an electronic device. The input stage 901 also allows configuration of hard coded logic. In some examples, components provided to an input stage include prepackaged logic such as intellectual property functions, mega-functions, and intellectual property cores. The input stage 901 may be a graphical user interface using wizards for allowing efficient or convenient entry of information. The input stage may also be a text interface or a program reading a data file such as a spreadsheet, database table, or schematic to acquire selection information. The input stage 901 produces an output containing information about the various modules selected. At this stage, the user may also add DFT components to the design.

In typical implementations, the generator program 905 can identify the selections and generate a logic description 903 with information for implementing the various modules. The generator program 905 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 905 identifies pointers and provides ports for each pointer. One tool with generator program capabilities is System on a Programmable Chip (SOPC) Builder available from Altera Corporation of San Jose, Calif. The generator program 905 also provides information to a synthesis tool 907 to allow HDL files to be automatically synthesized. In some examples, a logic description is provided directly by a designer. Hookups between various components selected by a user are also interconnected by a generator program. Some of the available synthesis tools are Leonardo Spectrum, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool at a verification stage 909.

As will be appreciated by one of skill in the art, the input stage 901, generator program 905, and synthesis tool 907 can be separate programs. The interface between the separate programs can be a database file, a log, or simply messages transmitted between the programs. For example, instead of writing a file to storage, the input stage 901 can send messages directly to the generator program 905 to allow the generator program to create a logic description. Similarly, the generator program can provide information directly to the synthesis tool instead of writing HDL files. Similarly, input stage 901, generator program 905, and synthesis tool 907 can be integrated into a single program.

A user may select various modules and an integrated program can then take the user selections and output a logic description in the form of a synthesized netlist without intermediate files. Any mechanism for depicting the logic to be implemented on an electronic device is referred to herein as a logic description. According to various embodiments, a logic description is an HDL file such as a VHDL, Abel, AHDL, or Verilog file. A logic description may be in various stages of processing between the user selection of components and parameters to the final configuration of the device. According to other embodiments, a logic description is a synthesized netlist such as an Electronic Design Interchange Format Input File (EDF file). An EDF file is one example of a synthesized netlist file that can be output by the synthesis tool 907.

A synthesis tool 907 can take HDL files and output EDF files. Tools for synthesis allow the implementation of the logic design on an electronic device. Some of the available synthesis tools are Leonardo Spectrum, available from Mentor Graphics Corporation of Wilsonville, Oreg. and Synplify available from Synplicity Corporation of Sunnyvale, Calif. Various synthesized netlist formats will be appreciated by one of skill in the art.

A verification stage 909 typically follows the synthesis stage 907. The verification stage checks the accuracy of the design to ensure that an intermediate or final design realizes the expected requirements. A verification stage typically includes simulation tools and timing analysis tools. At this stage, the user may also add or modify DFT components to the design. Tools for simulation allow the application of inputs and the observation of outputs without having to implement a physical device. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential devices such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif. After the verification stage 909, the synthesized netlist file can be provided to physical design tools 911 including place and route and configuration tools. A place and route tool locates logic cells on specific logic elements of a target hardware device and connects wires between the inputs and outputs of the various logic elements in accordance with logic and security provided to implement an electronic design. According to various embodiments of the present disclosure, the place and route tool may perform the techniques of the present disclosure to implement the various delay path requirements as defined by the user. The iterative technique may be transparent to the user, but the resulting device can be physically tested at 913.

For programmable logic devices, a programmable logic configuration stage can take the output of the place and route tool to program the logic device with the user selected and parameterized modules. According to various embodiments, the place and route tool and the logic configuration stage are provided in the Quartus Development Tool, available from Altera Corporation of San Jose, Calif. As will be appreciated by one of skill in the art, a variety of synthesis, place and route, and programmable logic configuration tools can be used using various techniques of the present disclosure.

As noted above, different stages and programs can be integrated in a variety of manners. According to one embodiment, the input stage 901, the generator program 905, the synthesis tool 907, the verification tools 909, and physical design tools 911 are integrated into a single program. The various stages are automatically run and transparent to a user. The program can receive the user-selected modules, generate a logic description depicting logic for implementing the various selected modules, and implement the electronic device. As will be appreciated by one of skill in the art, HDL files and EDF files are mere examples of a logic description. Other file formats as well as internal program representations are other examples of a logic description.

All or some portions of the disclosed techniques of the present disclosure (e.g., such as the DFT phase) may be implemented in any suitable combination of software and/or hardware system, such as a web-based server or desktop computer system. Moreover, a system implementing various embodiments of the present disclosure may be a portable device, such as a laptop or cell phone. The apparatus and/or web browser of this present disclosure may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the disclosed method steps.

Figure 10:
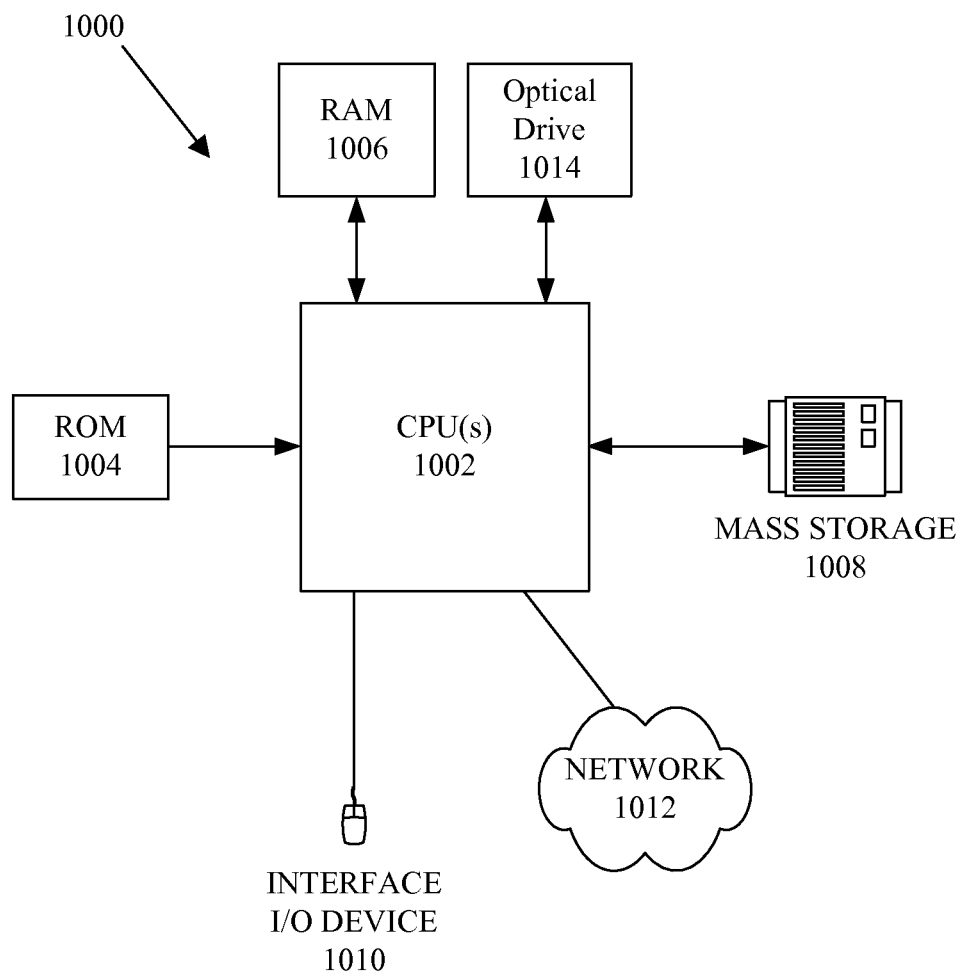
FIG. 10 is a block diagram of a typical computer system, in accordance with various embodiments of the present disclosure.

FIG. 10 is a diagrammatic representation showing a typical computer system that can be used to implement a device. The computer system includes any number of processors 1002 (also referred to as central processing units, or CPUs) that are coupled to devices including memory 1006 (typically a random access memory, or "RAM"), memory 1004 (typically a read only memory, or "ROM"). The processors 1002 can be arranged to generate an electronic design. As is well known in the art, memory 1004 acts to transfer data and instructions uni-directionally to the CPU and memory 1006 are used typically to transfer data and instructions in a bi-directional manner.

Both of these memory devices may include any suitable type of the computer-readable media described herein. A mass storage device 1008 is also coupled bi-directionally to CPU 1002 and provides additional data storage capacity and may include any of the computer-readable media described herein. The mass storage device 1008 may be used to store programs, data and the like and is typically a secondary storage medium such as a hard disk that is slower than memory. The mass storage device 1008 can be used to hold a library or database of prepackaged logic or intellectual property functions, as well as information on generating particular configurations. It will be appreciated that the information retained within the mass storage device 1008, may, in appropriate cases, be incorporated in standard fashion as part of memory 1006 as virtual memory. A specific mass storage device such as an optical drive 1014 may also pass data uni-directionally to the CPU.

CPU 1002 is also coupled to an interface 1010 that includes one or more input/output devices such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. The CPU 1002 may be a design tool processor. Finally, CPU 1002 optionally may be coupled to a computer or telecommunications network using a network interface as shown generally at 1012. With such a network connection, it is contemplated that the CPU might receive information from the network, or might output information to the network in the course of performing the above-described process steps. It should be noted that the system 1000 might also be associated with devices for transferring completed designs onto a programmable chip. The above-described devices and materials will be familiar to those of skill in the computer hardware and software arts.

Because such information and program instructions may be employed to implement the systems/methods described herein, the present disclosure relates to machine readable storage media that include program instructions, state information, etc. for performing various operations described herein. Examples of machine-readable storage media include, but are not limited to, magnetic media such as hard disks, floppy disks, and magnetic tape; optical media such as CD-ROM disks; magneto-optical media such as floptical disks; and hardware devices that are specially arranged to store and perform program instructions, such as ROM and RAM. Examples of program instructions include both machine code, such as produced by a compiler, and files containing higher level code that may be executed by the computer using an interpreter.

According to various embodiments, input may be obtained using a wide variety of techniques. For example, input for downloading or launching an application may be obtained via a graphical user interface from a user's interaction with a local application such as a mobile application on a mobile device, web site or web-based application or service and may be accomplished using any of a variety of well-known mechanisms for obtaining information from a user. However, it should be understood that such methods of obtaining input from a user are merely examples and that input may be obtained in many other ways.

Figure 11:
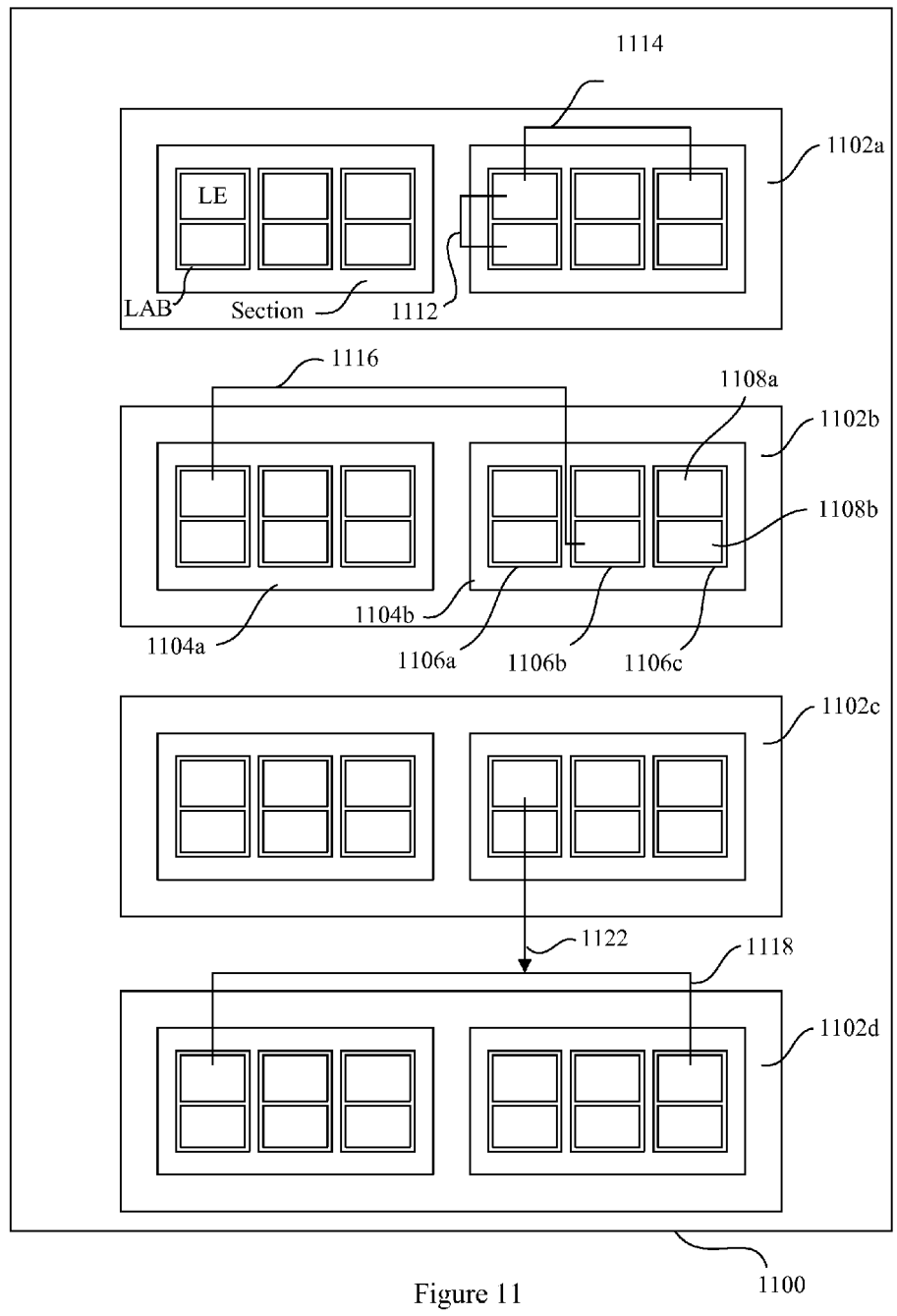
FIG. 11 is a block representation of the architecture of an arbitrary hardware device, including interconnects, in accordance with various embodiments of the present disclosure.

The form of a compiled design according to one or more embodiments of the present disclosure may be further understood with reference to a hypothetical target hardware device having multiple hierarchical levels. Such a hardware device is represented in FIG. 11. This representation roughly conforms to the layout of a FLEX 10K programmable logic device available from Altera Corporation of San Jose, Calif. In FIG. 11, a programmable logic device 1100 is segmented into a plurality of "rows" to facilitate interconnection between logic elements on a given row. In the hypothetical example shown, there are four rows: 1102a, 1102b, 1102c, and 1102d.

Each row of programmable logic device 1100 is further subdivided into two "half-rows." For example, row 1102b is shown to contain a half-row 1104a and a half-row 1104b. The next lower level of the hierarchy is the "logic array block" (LAB). Half-row 1104b, for example, contains three LABs: an LAB 1106a, an LAB 1106b, and an LAB 1106c. Finally, at the base of the hierarchy are several logic elements. Each such logic element may exist within a single logic array block. For example, LAB 1106c includes two logic elements: a logic element 1108a and a logic element 1108b.

In short, PLD 1100 includes four hierarchical levels: (1) rows, (2) half-rows, (3) LABs, and (4) logic elements (LEs). Any logic element within PLD 1100 can be uniquely specified (and located) by specifying a value for each of these four levels of the containment hierarchy. For example, logic element 1108b can be specified as follows: row (2), half-row (2), LAB (3), LE (2). To fit a logic design onto a target hardware device such as that shown in FIG. 11, a synthesized netlist may be divided into logic cells (typically containing one or more gates) which are placed in the various logic elements as uniquely defined above. Thus, each logic cell from the synthesized netlist resides in a unique single logic element.

Often, a multi-level hardware hierarchy such as that shown in PLD 1100 includes multiple levels of routing lines (interconnects). These connect the uniquely placed logic cells to complete circuits. In PLD 1100, for example, four levels of interconnect are provided, one for each of the four hierarchy levels. First a local interconnect such as interconnect 1112 is employed to connect two logic elements within the same LAB. At the next level, a LAB-to-LAB interconnect such as interconnect 1114 is employed to connect two LABs within the same half-row. At the next higher level, a "global horizontal" interconnect is employed to connect logic elements lying in the same row but in different half-rows. An example of a global horizontal interconnect is interconnect 1116 shown in row 1102b. Another global horizontal interconnect is shown as interconnect 1118, linking logic elements within row 1102d. Finally, a "global vertical" interconnect is employed to link a logic element in one row with a logic element in a different row. For example, a global vertical interconnect 1122 connects a logic element in the first LAB of the second half-row of row 1102c to two separate logic elements in row 1102d. In the embodiment shown, this is accomplished by providing global vertical interconnect 1122 between the above-described logic element in row 1102c to global horizontal interconnect 1118 in row 1102d. Consistent with the architecture of Altera Corporation's FLEX 10K CPLD, global vertical interconnects are directly coupled to the logic element transmitting a signal and indirectly coupled (through a global horizontal interconnect) to the logic elements receiving the transmitted signal.

In a target hardware device, there will be many paths available for routing a given signal line. During the routing stage, these various possible routing paths are evaluated to determine which is best for the design being fit. Briefly, in one FLEX 10K architecture, there are at least three rows, with two half-rows per row, and twelve LABs per half-row. Each LAB includes eight logic elements each of which, in turn, includes a 4-input look-up table, a programmable flip-flop, and dedicated signal paths for carry and cascade functions. The eight logic elements in an LAB can be used to create medium-sized blocks of logic—such as 9-bit counters, address decoders, or state machines—or combined across LABs to create larger logic blocks.

It should be understood that the present disclosure is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of ICs that can benefit from application of the present disclosure.

Figure 12:
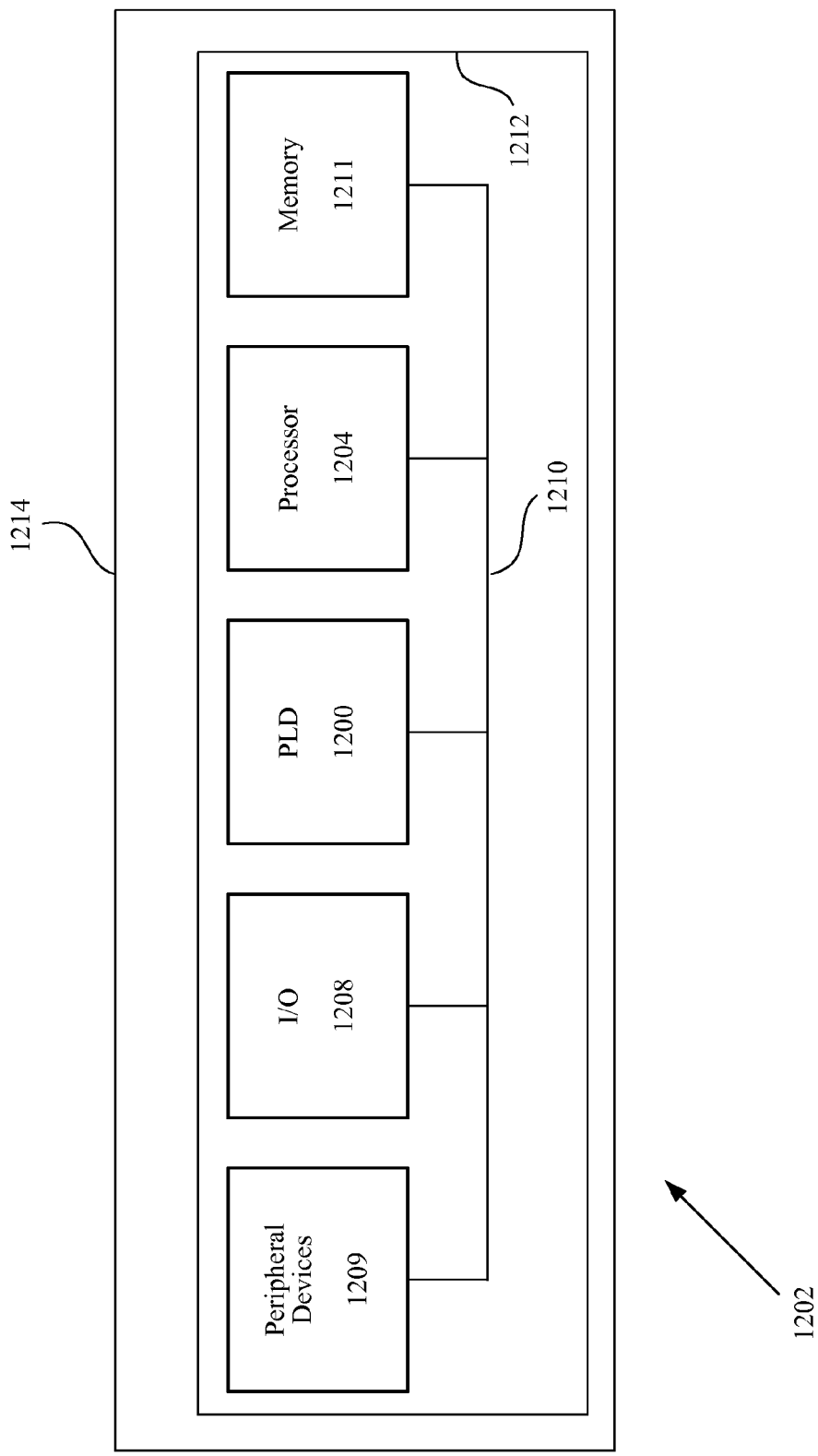
FIG. 12 is a block diagram depicting a system containing a PLD, in accordance with various embodiments of the present disclosure.

Embodiments of this present disclosure can also relate to programmable logic and other devices programmed with a design prepared in accordance with the above described methods and/or using a computer program product according to one or more embodiments of the present disclosure. Certain embodiments may further relate to systems employing such programmable logic devices. FIG. 12 illustrates a PLD 1200 of the present disclosure in a data processing system 1202. The data processing system 1202 may include one or more of the following components: a processor 1204; memory 1211; I/O circuitry 1208; and peripheral devices 1209. These components are coupled together by a system bus 1210 and are populated on a circuit board 1212 which is contained in an end-user system 1214.

The system 1202 can be used in a wide variety of applications, such as computer networking, data networking, instrumentation, video processing, digital signal processing, or any other application where the advantage of using reprogrammable logic is desirable. The PLD 1200 can be used to perform a variety of different logic functions.

Although the foregoing present disclosure has been described in some detail for purposes of clarity of understanding, it will be apparent that certain changes and modifications may be practiced within the scope of the appended claims. Therefore, the present embodiments are to be considered as illustrative and not restrictive and the present disclosure is not to be limited to the details given herein, but may be modified within the scope and equivalents of the appended claims.

What is claimed is:

1. A method for designing a system on a target device, comprising:
   inserting a system reset controller that includes a clock signal input, a reset signal input, a clock signal output, and a reset signal output, wherein the system reset controller is arranged to receive distributed clock and reset signal inputs and output modified clock and reset signal outputs such that the reset controller resets the system using an asynchronous reset signal without requiring downstream asynchronous elements;
   removing identified resets that are time-delayed re-implementations of resets earlier in a data path; and
   increasing a length of a system reset controller's reset sequence such that non-removed resets earlier in the data path have sufficient time to propagate forward to locations of the removed identified resets.

2. The method of claim 1, wherein logic elements with asynchronous reset inputs in the design for the system are replaced in the second design for the system by logic elements that do not require or have asynchronous reset inputs.

3. The method of claim 1, further comprising back-annotating sufficient information into a user-specific design in order to allow a simulator to correctly simulate actual reset behavior.

4. The method of claim 1, wherein the system reset controller is generated, inserted, and parameterized via a software library function.

5. The method of claim 1, wherein the reset controller is further arranged to generate a free-running clock such that a circuit coupled to the reset controller can be properly reset in an absence of an externally-applied clock.

6. The method of claim 1 wherein the reset controller is further arranged to ensure a parameterized minimum number of clock pulses in any generated reset sequence.

7. The method of claim 1, wherein the reset controller further comprises configuration RAM that includes information that specifies parameterized parts of controller behavior, the information including a number of clock cycles in a reset sequence.

8. The method of claim 1, wherein the system reset controller includes a clock multiplexor that selects between the clock input signal or an internal oscillator output signal.

9. The method of claim 1, wherein removing the identified resets results in no signal being transmitted to a reset input of a component corresponding to the identified resets.

10. A non-transitory computer readable medium, having stored thereon sequences of instructions, the sequences of instructions when executed by a processor causes the processor to perform a method of designing a system on a target device, comprising:
   inserting a system reset controller that includes a clock signal input, a reset signal input, a clock signal output, and a reset signal output, wherein the system reset controller is arranged to receive distributed clock and reset signal inputs and output modified clock and reset signal outputs such that the reset controller resets the system using an asynchronous reset signal without requiring downstream asynchronous elements;
   removing identified resets that are time-delayed re-implementations of resets earlier in a data path; and
   increasing a length of a system reset controller's reset sequence such that non-removed resets earlier in the data path have sufficient time to propagate forward to locations of the removed identified resets.

11. The non-transitory computer readable medium of claim 10, wherein logic elements with asynchronous reset inputs in the design are replaced by logic elements that do not require or have asynchronous reset inputs.

12. The non-transitory computer readable medium of claim 10, further comprising back-annotating sufficient information into a user-specific design in order to allow a simulator to correctly simulate actual reset behavior.

13. The non-transitory computer readable medium of claim 10, wherein the system reset controller is generated, inserted, and parameterized via a software library function.

14. The non-transitory computer readable medium of claim 10, wherein the reset controller is further arranged to generate a free-running clock such that a circuit coupled to the reset controller can be properly reset in an absence of an externally-applied clock.

15. The method of claim 10, wherein the reset controller is further arranged to ensure a parameterized minimum number of clock pulses in any generated reset sequence.

16. The method of claim 10, wherein the reset controller further comprises configuration RAM that includes information that specifies parameterized parts of controller behavior, the information including a number of clock cycles in a reset sequence.

17. The non-transitory computer readable medium of claim 10, wherein the system reset controller includes a clock multiplexor that selects between the clock input signal or an internal oscillator output signal.

18. The non-transitory computer readable medium of claim 10, wherein removing the identified resets results in no signal being transmitted to a reset input of a component corresponding, to the identified resets.

19. A design tool, comprising:
   a synthesis tool that synthesizes a design for a system and that inserts a system reset controller that includes a clock signal input, a reset signal input, a clock signal output, and a reset signal output, wherein the system reset controller is arranged to receive distributed clock and reset signal inputs and output modified clock and reset, signal outputs such that the reset controller resets the system using an asynchronous reset signal without requiring downstream asynchronous elements, removes identified resets that are time-delayed re-implementations of resets earlier in a data path, and increases a length of a system reset controller's reset sequence such that non-removed resets earlier in the data path have sufficient time to propagate forward to locations of the removed identified resets.

* * * * *